(12) United States Patent
Nishio et al.

(10) Patent No.: US 7,385,281 B2
(45) Date of Patent: Jun. 10, 2008

(54) SEMICONDUCTOR INTEGRATED CIRCUIT DEVICE

(75) Inventors: Yoji Nishio, Tokyo (JP); Seiji Funaba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 165 days.

(21) Appl. No.: 11/019,553

(22) Filed: Dec. 23, 2004

(65) Prior Publication Data

US 2005/0139977 A1 Jun. 30, 2005

(30) Foreign Application Priority Data

Dec. 25, 2003 (JP) ............... 2003/428888

(51) Int. Cl.
| | |
|---|---|
| *H01L 23/02* | (2006.01) |
| *H01L 23/12* | (2006.01) |
| *G11C 7/00* | (2006.01) |
| *G06F 13/00* | (2006.01) |
| *H01I 23/14* | (2006.01) |

(52) U.S. Cl. .............. 257/686; 257/E23.062; 257/E23.063; 257/E23.079; 257/685; 257/723; 257/777; 257/668; 257/E25.013; 257/E23.052; 257/E25.023; 257/E23.172; 257/E25.029; 257/E23.013

(58) Field of Classification Search ........ 257/E23.062, 257/E23.063, E23.079, E25.013, E23.052, 257/686, 685, 777, 668, 723, E23.172, E25.029, 257/E23.013, E23.023, E23.101, E25.011
See application file for complete search history.

(56) References Cited

U.S. PATENT DOCUMENTS

| | | | |
|---|---|---|---|
| 6,133,640 A | 10/2000 | Leedy | |
| 6,538,331 B2* | 3/2003 | Masuda et al. | 257/777 |
| 6,611,057 B2* | 8/2003 | Mikubo et al. | 257/714 |
| 7,032,196 B2* | 4/2006 | Takeoka et al. | 716/4 |
| 7,089,032 B2* | 8/2006 | Hongo et al. | 455/550.1 |
| 7,102,905 B2* | 9/2006 | Funaba et al. | 365/51 |
| 7,104,804 B2* | 9/2006 | Batinovich | 439/71 |
| 7,123,497 B2* | 10/2006 | Matsui et al. | 365/63 |
| 2002/0015340 A1 | 2/2002 | Batinovich | |
| 2002/0081838 A1 | 6/2002 | Bohr | |
| 2003/0168725 A1* | 9/2003 | Warner et al. | 257/686 |
| 2003/0222350 A1 | 12/2003 | Sawada | |
| 2004/0061147 A1* | 4/2004 | Fujita et al. | 257/232 |
| 2004/0222534 A1* | 11/2004 | Sawamoto et al. | 257/778 |

FOREIGN PATENT DOCUMENTS

| | | |
|---|---|---|
| CN | 1130441 A | 9/1996 |
| JP | 6-177318 A | 6/1994 |
| JP | H06-291250 A | 10/1994 |
| JP | H09-504654 A | 5/1997 |
| JP | 2001-102479 A | 4/2001 |

OTHER PUBLICATIONS

"Research Achievement of 2002", Association of Super-Advanced Electronics Technologies, 2002, pp. 208-210.

* cited by examiner

*Primary Examiner*—Alexander Oscar Williams
(74) *Attorney, Agent, or Firm*—Sughrue Mion, PLLC

(57) ABSTRACT

A COC DRAM including a plurality of stacked DRAM chips is mounted on a motherboard by using an interposer. The interposer includes a Si unit and a PCB. The Si unit includes a Si substrate and an insulating-layer unit in which wiring is installed. The PCB includes a reference plane for the wiring in the Si unit. The wiring topology between a chip set and the COC DRAM is the same for every signal. Accordingly, a memory system enabling a high-speed operation, low power consumption, and large capacity is provided.

21 Claims, 27 Drawing Sheets

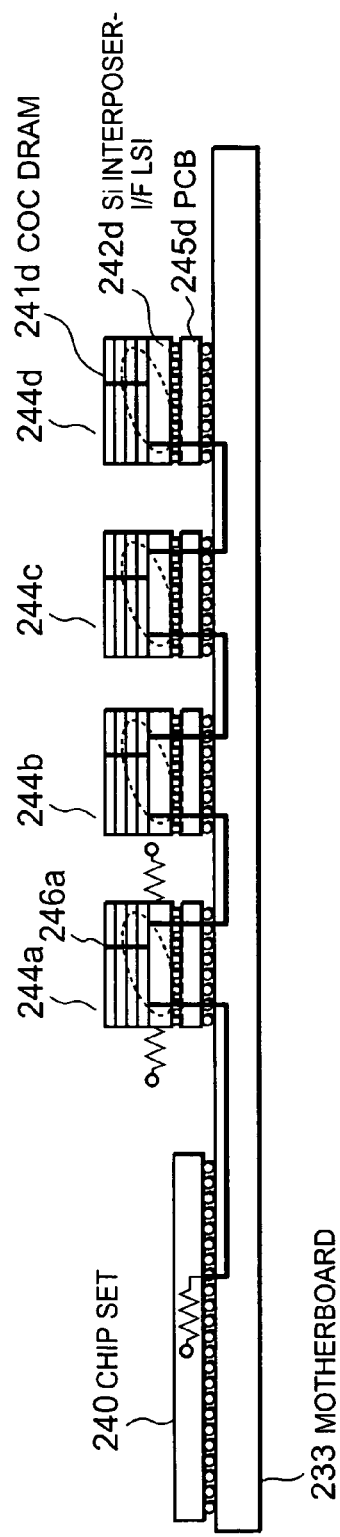
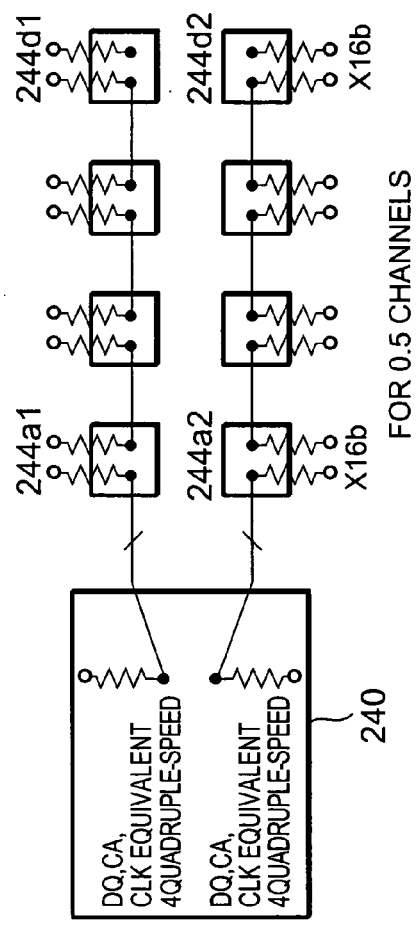

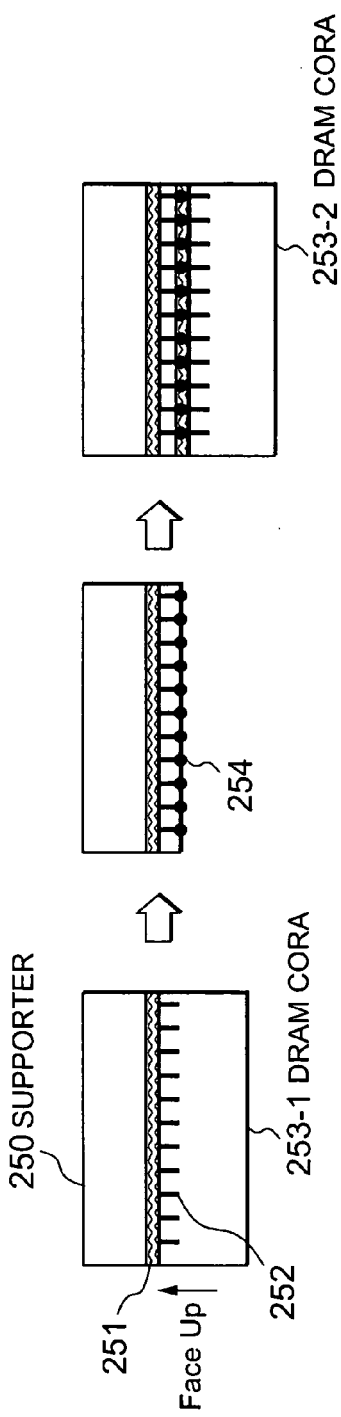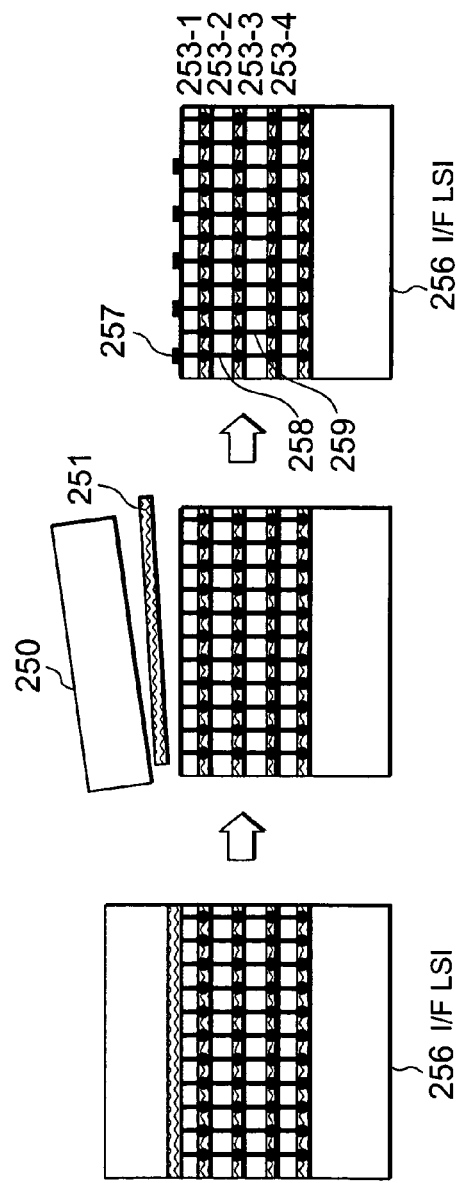

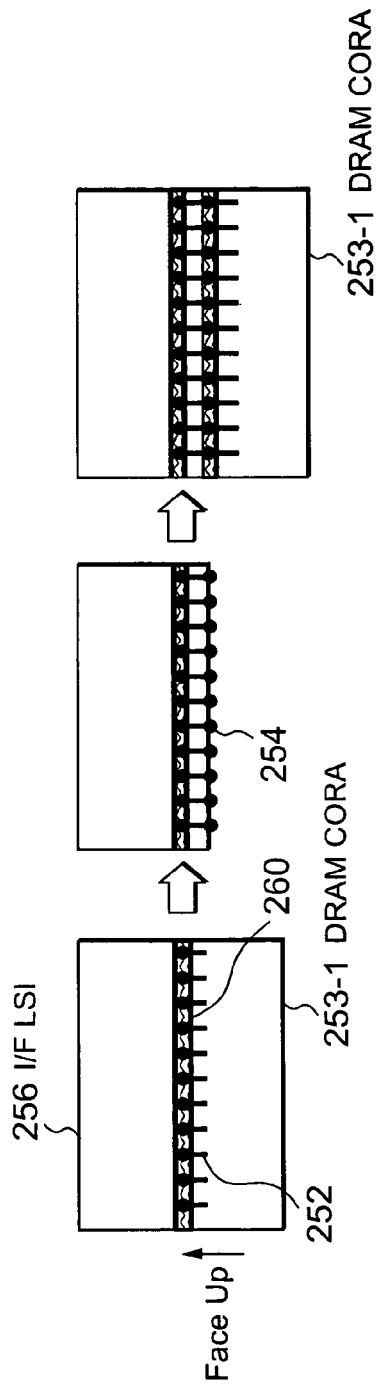
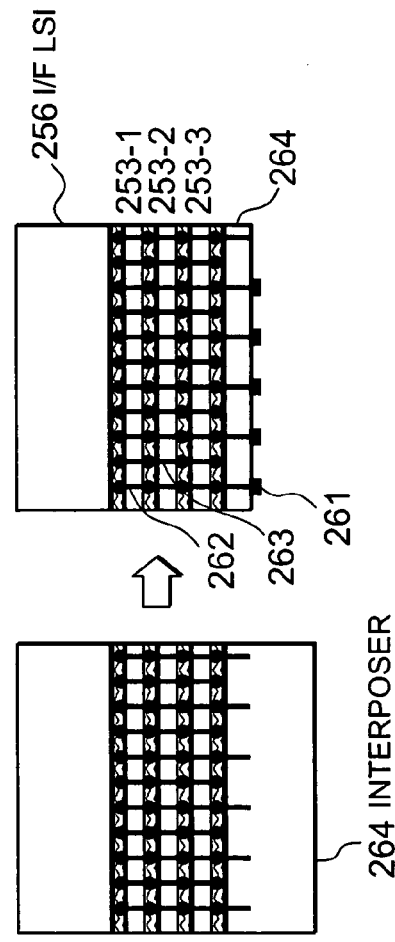
FIG. 27A
FIG. 27B
FIG. 27C
FIG. 27D
FIG. 27E

SEMICONDUCTOR INTEGRATED CIRCUIT DEVICE

This application claims priority to prior application JP 2003-428888, the disclosure of which is incorporated herein by reference.

BACKGROUND OF THE INVENTION

1. Field of the Invention

The present invention relates to a semiconductor integrated circuit (IC) device. In particular, the present invention relates to a semiconductor IC device including a stacked dynamic random access memory (stacked DRAM) or a chip on chip DRAM (COC DRAM).

2. Description of the Related Art

FIG. 1 shows an example of a memory system which is presently studied by Joint Electron Device Engineering Council (JEDEC).

The memory system shown in FIG. 1 includes a chip set 4 mounted on a motherboard (not shown) and a plurality of (two of them are shown here) dual inline memory modules (DIMMs) 1a and 1b for transmitting/receiving signals to/from the chip set 4. A buffer 2a or 2b and a plurality of (8 in this case) DRAM chips 3a or 3b are mounted on each of the DIMMs 1a and 1b.

The chip set 4 is connected to the buffer 2a of the DIMM 1a and the buffers 2a and 2b of the adjoining DIMMs 1a and 1b are connected to each other so that signals are transmitted/received therebetween by point-to-point. The data rate of the signals is estimated to be about 6.4 to 9.6 Gbps. The signals transmitted/received between the chip set 4 and each of the DIMMs 1a and 1b include a DQ (data) signal and a CA (command address) signal. These signals are transmitted as differential transmission signals. About 150 to 200 signal lines are required for transmitting these signals.

On each of the DIMMs 1a and 1b, the buffer 2 and each DRAM chip 3 are connected by using different methods depending on the types of signals. Specifically, point-to-point connection is used for DQ signals (DQ signal and DQS (strobe) signal). The data rate thereof is estimated to be about 1.6 Gbps. On the other hand, fly-by connection is used for a CA signal and a CLK (clock) signal. In the fly-by connection, a DRAM is placed on a main bus disposed in a module substrate such that the DRAM is connected to the main bus. The number of signal lines led from the buffer 2 is about 200 to 250, including those for differential transmission signals and single-end transmission signals.

The size of the package of the buffer 2 is set to about 21 mm×21 mm to 25 mm×25 mm by considering space for signal balls, VDD balls, GND balls, and no connection, if a ball pitch is 0.8 mm.

Although not shown in FIG. 1, a terminating resistor is provided in a receiving side in point-to-point connection. In fly-by connection, a terminating resistor is provided at a farthest end.

On the other hand, techniques of stacking a plurality of IC chips or large-scale integration (LSI) chips for a purpose of high integration of an IC have been suggested (for example, see Japanese Laid-Open Patent Publication No. 6-291250 (Document 1); U.S. Pat. No. 6,133,640 (Document 2); PCT Japanese Laid-Open Patent Publication No. 9-504654 (Document 3); and the Research Achievement of 2002 by Association of Super-Advanced Electronics Technologies (ASET) (Document 4)).

Document 1 describes a technique of connecting pads for signals of same attribute, such as address signals, by through electrodes. Document 2 describes a technique of stacking a memory-array circuit and a controller circuit. Document 3 describes a technique of stacking a memory chip and an interface LSI. Further, Document 4 describes a technique of forming a transmission line by using a Si interposer.

In the known memory system shown in FIG. 1, the distance between each of the DRAM chips and the buffer 2 in each DIMM is different one from another. Therefore, in this memory system, the buffer must operate according to the farthest DRAM chip, so that it is difficult to increase the operation speed. This problem can be solved to some extent by allowing the buffer to perform synchronizing processing or the like. In that case, however, another problem will arise, that is, the performance of the entire system is degraded and the cost increases.

Also, in the known memory system, the topology of a CLK signal or the like is different from the topology of DQ signals in each DIMM, and thus the difference in arrival time (propagation time) between a CLK signal and a DQS signal is caused in each DRAM chip. The difference must not exceed 15% of one clock cycle in view of the system design, and this cannot be realized if a clock frequency increases.

Further, in the known memory system, a terminating resistor must be provided in every transmission line, so that a large amount of electric power is consumed by the terminating resistors disadvantageously.

Still further, in the known memory system, a single-chip DRAM or a stacked (2-chip) DRAM is used as each DRAM. With this configuration, the occupied area increases as the memory capacity increases.

The above-mentioned Documents 1 to 4 do not at all disclose the entire configuration of the memory system, in particular, the configuration of the interposer, a method for placing through electrodes in a stacked DRAM, or a method for providing a terminating resistor.

Further, in the technique described in Document 4, the thickness of the insulating layer is no less than 10 μm (10 times thicker than an insulating layer which is usually used in LSI). Such a thick insulating layer is difficult to fabricate in an ordinary LSI manufacturing process. In addition, DC resistance Rdc of a transmission line shown in Document 4, having a width of 12.5 μm, a thickness of 1 μm, and a length of 10 mm, is $Rdc = (1/58e^6) \times (10e^{-3})/((1e^{-6}) \times (12.5e^{-6})) = 14$ Ω). This value is a little too large for a transmission line using a terminating resistor of about 50 Ω.

SUMMARY OF THE INVENTION

The present invention has been made in view of the problems of the above-described known art, and an object of the present invention is to provide a semiconductor integrated circuit device which enables a higher-speed operation, lower power consumption, and larger capacity.

In order to achieve the object, the present invention adopts a stacked DRAM structure (chip on chip (COC) DRAM structure). In this structure, a mismatch of characteristic impedance and an increase in DC resistance which occur in a signal transmission line of point-to-point connection between a chip set and an interface LSI (I/F LSI) are improved by using an interposer including a silicon (Si) unit and a printed circuit board (PCB).

When the I/F LSI is disposed face up, about 400 through electrodes must be provided in the I/F LSI. Since the area for providing these through electrodes is limited, the pitch of the through electrodes is about 40 μm at some parts. Therefore, it is difficult to directly connect the I/F LSI and the PCB, which has a via pitch of about 0.8 mm, and thus silicon, which is the material of the I/F LSI, is needed as an interposer. That is, a Si interposer is required for pitch conversion of signals (electrodes or connection terminals).

Further, electrode terminals on the lower surface of the Si interposer are connected to the PCB by means of flip-chip connection, which has almost the same size as the Si interposer. Also, solder balls are provided on the lower surface of the PCB, and the PCB is connected to a motherboard. With this configuration, the reliability of the system is increased. Further, a group of the COC DRAM, I/F LSI, Si interposer, and PCB can be regarded as one unit, which can be easily handled. Still further, by providing a reference plane for signal wiring in the Si interposer in the PCB, the characteristic impedance and the DC resistance of the wiring provided in the Si interposer can be set to appropriate values. That is, the PCB is essential in terms of electrical characteristic, reliability, and easy handling. A combination of the Si interposer and the PCB can be regarded as a two-layered interposer.

Also, in order to achieve the above-described object, in the present invention, the wiring topology of each signal (e.g., DQS signal and CLK signal) between the I/F LSI and the stacked DRAM is set to the same so as to eliminate difference of signal delay. Further, a terminating resistor for each signal is removed.

Further, in order to reduce the area occupied by DRAM chips, a COC DRAM structure is adopted. In this structure, a plurality of DRAM chips, each having a thickness of about 50 μm, are stacked, and the DRAM chips are connected by through electrodes.

Specifically, according to an aspect of the present invention, a semiconductor integrated circuit device includes a motherboard on which a chip set is mounted; and a memory unit which is mounted on the motherboard and which is connected to the chip set. A stacked DRAM including a plurality of stacked DRAM chips is used as the memory unit, and an interposer is used for mounting the stacked DRAM on the motherboard.

Preferably, the interposer includes a silicon unit including wiring for electrically connecting the stacked DRAM and the chip set. A reference plane, which gives a potential reference to the wiring, is disposed nearer the motherboard in relation to the silicon unit.

The semiconductor integrated circuit device may further include an interface LSI for mediating signal transmission/reception between the stacked DRAM and the chip set, the interface LSI being disposed between the stacked DRAM and the interposer. The interface LSI and the chip set are connected by point-to-point connection via the interposer and the motherboard.

Further, the interposer includes a printed circuit board which is disposed under the silicon unit and which has substantially the same size as that of the silicon unit, and the reference plane is disposed in the printed circuit board.

The semiconductor integrated circuit device includes a plurality of groups, each group including the stacked DRAM and the interposer. The plurality of groups are connected to the chip set by point-to-point connection or by common connection.

The semiconductor integrated circuit device includes a plurality of groups, each group including the stacked DRAM and the interposer. Main buses for a command-address signal and main buses for a data signal are disposed in the motherboard such that the main buses for the command-address signal are orthogonal to those for the data signal immediately under each group so that the plurality of groups are connected to the chip set by fly-by connection. A stub length from each of the main buses for the command-address signal and the data signal to the stacked DRAM of each group is 2 mm or less.

Alternatively, the interposer may be a Si interposer-interface LSI for mediating transmission/reception of signals between the stacked DRAM and the chip set.

The semiconductor integrated circuit device includes a plurality of groups, each group including the stacked DRAM and the Si interposer-interface LSI. The plurality of groups are arranged in a matrix pattern, and main buses for a command-address signal and main buses for a data signal are arranged in a grid pattern in the motherboard such that the main buses for the command-address signal are orthogonal to those for the data signal in an area provided with each group so that the plurality of groups are connected to the chip set by fly-by connection.

The semiconductor integrated circuit device includes a plurality of groups, each group including the stacked DRAM and the Si interposer-interface LSI. The plurality of groups are arranged in a matrix pattern, and main buses for a command-address signal and main buses for a data signal are arranged in parallel in the motherboard such that the main buses are parallel to each other immediately under each group so that the plurality of groups are connected to the chip set by fly-by connection.

The semiconductor integrated circuit device includes a plurality of groups, each group including the stacked DRAM and the Si interposer-interface LSI. The plurality of groups are arranged in a matrix pattern. The groups in the nearest row to the chip set are connected to the chip set by point-to-point connection. Whereas, in the groups belonging to the other rows, adjoining groups in each line are connected to each other by point-to-point connection.

According to the present invention, the skew of each signal can be reduced because stacked DRAMs are used. Also, impedance matching of each signal line can be easily realized because an interposer is disposed between the stacked DRAM and a motherboard. Accordingly, the present invention can provide a semiconductor integrated circuit device (memory system) capable of performing a high-speed operation.

Also, according to the present invention, since the stacked DRAM can be regarded as lumped constant, a terminating resistor need not be provided in each DRAM chip. With this configuration, the number of terminating resistors can be reduced compared to the known art and thus power consumption by the terminating resistors can be reduced. Accordingly, the present invention can provide a semiconductor integrated circuit device (memory system) of low power consumption.

Further, according to the present invention, since the stacked DRAMs are used, the capacity of memory can be increased by increasing the number of stacked DRAM chips. Accordingly, the present invention can provide a semiconductor integrated circuit device (memory system) of large capacity for its occupied area.

BRIEF DESCRIPTION OF THE DRAWINGS

FIGS. 2A and 2B show the configuration of a memory system according to a first embodiment of the present invention, wherein FIG. 2A is a longitudinal cross-sectional view and FIG. 2B is a plan view;

FIGS. 9A and 9B illustrate a method for placing an I/F LSI in the memory system shown in FIGS. 2A and 2B and FIG. 8, wherein FIG. 9A shows a face-up placement and FIG. 9B shows a face-down placement;

FIGS. 10A and 10B illustrate the configuration of the I/F LSI used in the memory system shown in FIGS. 2A and 2B and FIG. 8, in which FIG. 10A is a circuit diagram thereof and FIG. 10B is a typical circuit diagram for comparison;

FIGS. 11A and 11B show the configuration of a memory system according to a third embodiment of the present invention, wherein FIG. 11A is a longitudinal cross-sectional view and FIG. 11B is a plan view;

FIGS. 12A and 12B show the configuration of a memory system according to a fourth embodiment of the present invention, wherein FIG. 12A is a longitudinal cross-sectional view and FIG. 12B is a plan view;

FIGS. 13A and 13B illustrate assignment of signals to balls of the interposer in the memory system shown in FIGS. 11A and 11B and FIGS. 12A and 12B, wherein FIG. 13A is a longitudinal cross-sectional view and FIG. 13B is a plan view;

FIGS. 15A and 15B show the configuration of a memory system according to a fifth embodiment of the present invention, wherein FIG. 15A is a longitudinal cross-sectional view and FIG. 15B is a plan view;

FIGS. 20A and 20B show the configuration of a memory system according to a sixth embodiment of the present invention, wherein FIG. 20A is a longitudinal cross-sectional view and FIG. 20B is a plan view;

FIGS. 24A and 24B show the configuration of a memory system according to a seventh embodiment of the present invention, wherein FIG. 24A is a longitudinal cross-sectional view and FIG. 24B is a plan view;

FIGS. 25A and 25B show the configuration of a memory system according to an eighth embodiment of the present invention, wherein FIG. 25A is a longitudinal cross-sectional view and FIG. 25B is a plan view;

FIGS. 26A to 26F illustrate a method for stacking a COC DRAM and an I/F LSI which can be applied to the memory system shown in FIGS. 15A and 15B, FIGS. 20A and 20B, FIGS. 24A and 24B, and FIGS. 25A and 25B; and FIGS. 27A to 27E illustrate a method for stacking a COC DRAM, an I/F LSI, and an interposer which can be applied to the memory system shown in FIGS. 15A and 15B, FIGS. 20A and 20B, FIGS. 24A and 24B, and FIGS. 25A and 25B.

DESCRIPTION OF THE PREFERRED EMBODIMENTS

Hereinafter, embodiments of the present invention will be described with reference to the drawings.

Figure 1:
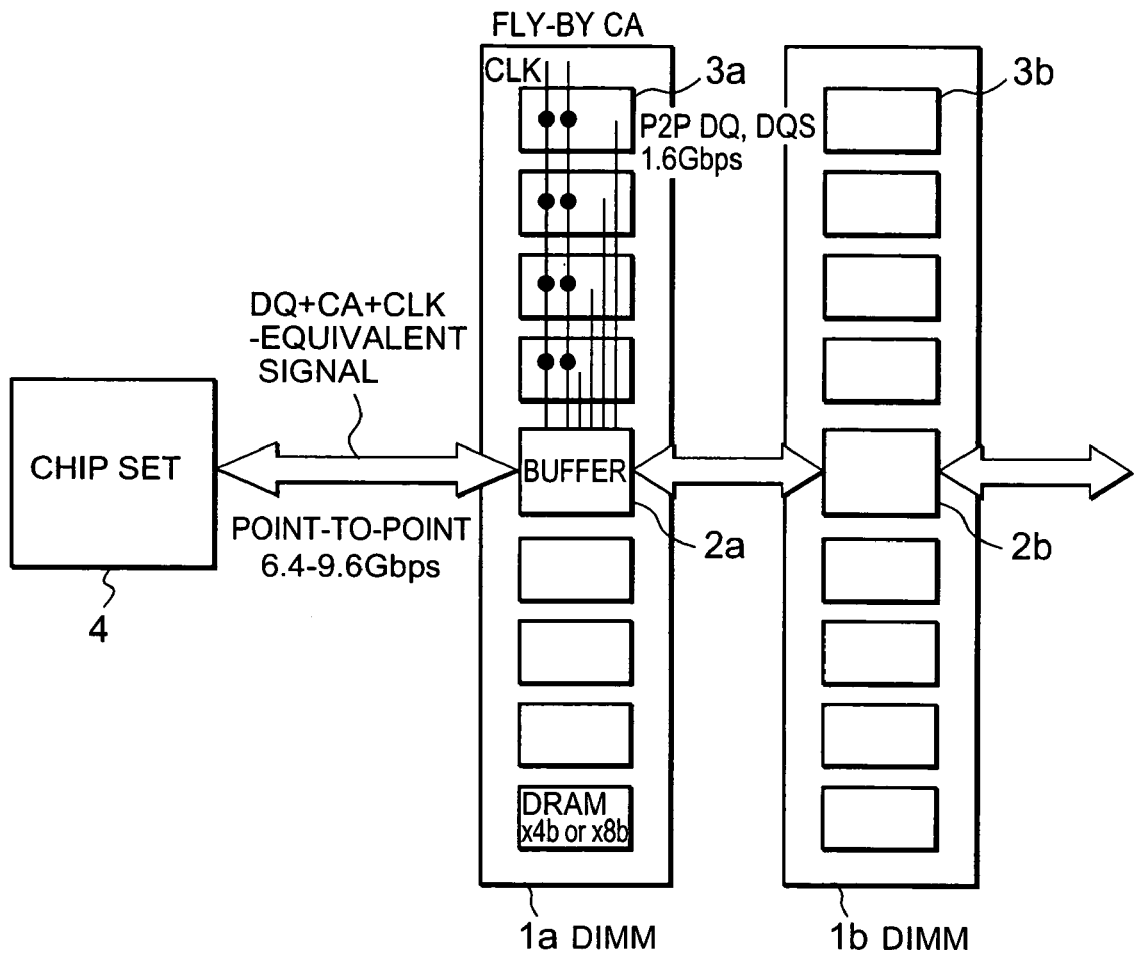
FIG. 1 is a schematic view showing the configuration of a known memory system.
Figure 2:
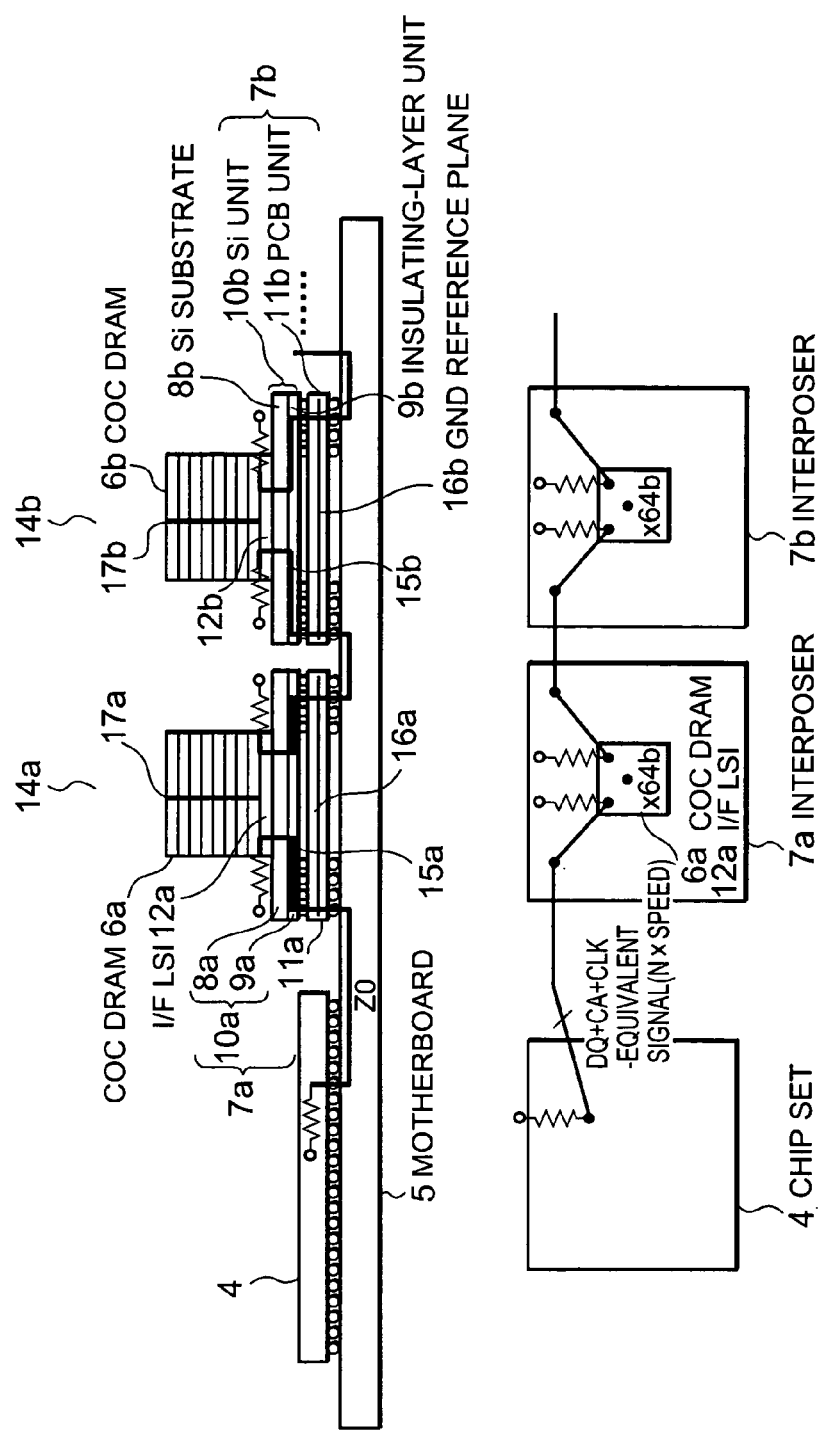

FIGS. 2A and 2B schematically show the configuration of a memory system (semiconductor integrated circuit (IC) device) according to a first embodiment of the present invention, in which FIG. 2A is a longitudinal cross-sectional view and FIG. 2B is a plan view.

The memory system shown in FIGS. 2A and 2B includes a chip set 4 mounted on a motherboard 5 and a plurality of (two of them are shown here) stacked DRAMs 14a and 14b. Each of the stacked DRAMs 14a and 14b includes a chip on chip DRAM (COC DRAM) 6a (6b) including 8 to 16 stacked DRAM chips, an interface LSI (I/F LSI) 12a (12b) on which the COC DRAM 6a (6b) is stacked, and an interposer 7a (7b) which is disposed under the I/F LSI 12a (12b) and which includes a silicon (Si) unit 10a (10b) and a printed circuit board (PCB) 11a (11b).

The Si unit 10a (10b) of the interposer 7a (7b) includes a Si substrate 8a (8b) and an insulating-layer unit 9a (9b). The Si unit 10a (10b) and the PCB 11a (11b) of the interposer 7a (7b) are connected to each other by means of flip-chip connection. The PCB 11a (11b) of the interposer 7a (7b) is connected to the motherboard 5 by using solder balls.

Signal transmission between the chip set 4 and the I/F LSI 12a is performed by point-to-point connection. In the motherboard 5, the chip set 4 and the I/F LSI 12a are wired so as to have characteristic impedance Z0. In the interposer 7a, this wiring is realized as a wiring line 15a running in the horizontal direction in the insulating-layer unit 9a.

Likewise, signal transmission between the I/F LSIs 12a and 12b is performed by point-to-point connection. In the motherboard 5, a signal line between the I/F LSIs 12a and 12b is provided so that the characteristic impedance is Z0. In the interposer 7b, the wiring is realized as a wiring line 15b running in the horizontal direction in the insulating-layer unit 9b.

GND reference planes 16a and 16b, which provide a potential reference to the wiring lines 15a and 15b in the interposers 7a and 7b, are disposed in the PCBs 11a and 11b, respectively. By using the function of the GND reference planes 16a and 16b, the characteristic impedance of each of the wiring lines 15a and 15b is set to Z0 and the DC resistance thereof is set to about 3Ω or less. The wiring line 15 and the GND reference plane 16 in the interposer 7 will be described in detail later.

In the above-described manner, the characteristic impedance at the point-to-point connection is set to Z0 throughout the wiring in the memory system shown in FIGS. 2A and 2B. Further, the receiving side of the point-to-point connection is terminated by terminating resistance Z0, and the driver side is impedance-matched by source resistance Z0. As a result, in signal transmission at the point-to-point connection, reflections can be suppressed and favorable signal integrity can be obtained.

Signals at the point-to-point connection are so-called protocol signals, including information such as a DQ signal and a CA signal, and the number of signal lines is 150 to 200. The signals at the point-to-point connection are transmitted at a data rate 4 to 6 times faster than that of DRAM. For example, when the data rate of the DRAM is 1.6 Gbps, the data rate at the point-to-point connection is 6.4 to 9.6 Gbps. Incidentally, the stacked DRAM should preferably have a ×64 bits structure when 1 channel is 8 bytes.

In each of the stacked DRAMs 14a and 14b, signal transmission between the I/F LSI 12 and the COC DRAM 6 is performed via a through electrode 17 which is disposed through the COC DRAM 6 in the stacking direction (vertical direction). Although only one through electrode 17 is shown in FIGS. 2A and 2B, a required number of through electrodes are actually provided for DQ, CA, and power-supply signals. The signals include a DQ signal, a DQS signal, a CA signal, a CLK signal, etc., which are transmitted/received by being distinguished from each other. However, all wiring lines including the through electrode 17 have the same topology, and thus a skew of each signal is hardly generated. Further, the length of the through electrode 17 is short, about 0.4 mm in 8-chip stack, and this portion can be regarded as a lumped-constant circuit. Therefore, no terminating resistor is required. With this configuration, power consumption by a terminating resistor does not occur when a signal is transmitted between the I/F LSI 12 and the COC DRAM 6, so that an operation at low power consumption can be realized.

As described above, signals are transmitted/received by point-to-point connection between the chip set 4 and the I/F LSI 12a and between the adjoining I/F LSIs 12a and 12b. The data rate is about 6.4 to 9.6 Gbps. The signals include differential transmission protocol signals, including information such as a DQ (data) signal and a CA (command address) signal required for a memory, and the number of signal lines is about 150 to 200. On the other hand, the number of balls at the PCB 11 is about 300 to 400, including those for the power supply and the ground (GND). The total number of balls is 500 to 600, including a window and no connection. Herein, when the ball pitch is 0.8 mm, the size of the PCB 11 is about 20 mm×20 mm.

On the other hand, signals transmitted/received between the I/F LSI 12 and the COC DRAM 6 include DQ, CA, and CLK (clock) signals, which are transmitted/received by type of signals. The data rate of DQ signals is about 1.6 Gbps. The number of signal lines used herein is about 200 to 250, including those for differential transmission signals and single-ended transmission signals.

The size of the COC DRAM 6 is about 10 mm×10 mm, and the size of the I/F LSI 12 is set correspondingly. When the I/F LSI 12 is disposed face up, approximately 400 through electrodes must be provided in the I/F LSI 12, including those for the power supply and the GND.

In the I/F LSI 12, the place for providing the through electrodes is limited, and thus the pitch of the through electrodes must be set to about 40 μm in some cases. Therefore, it is difficult to directly connect the I/F LSI 12 and the PCB 11, which has a via pitch of about 0.8 mm. For this reason, the Si unit 10, which serves as an interposer for converting the pitch of signal lines (wiring lines) and which comprises the same material as that of the I/F LSI 12, is disposed between the I/F LSI 12 and the PCB 11.

The PCB 11, which has almost the same size as that of the Si unit 10, is connected to electrode terminals on the lower surface of the Si unit 10 by flip chip connection. The PCB 11 is connected to the motherboard 5 by using solder balls formed on a lower surface thereof. With this configuration, the reliability of the memory system is enhanced. Further, the stacked DRAM 14 including the COC DRAM 6, the I/F LSI 12, the Si unit 10, and the PCB 11 can be regarded as a single package, which can be easily handled. Furthermore, since the GND reference plane 16 for providing a potential reference to signal lines is disposed in the PCB 11, the characteristic impedance and DC resistance of the wiring line 15 provided in the Si unit 10 can be set to appropriate values. In this way, the PCB 11 enables improved electrical characteristic, reliability, and easy handling.

The length of the wiring line 15 in the interposer 7 may be about 10 to 15 mm, so it is important to allow the wiring in the interposer 7 to have a favorable transmission characteristic in the above-describe manner.

Next, the operation of the memory system shown in FIGS. 2A and 2B will be described.

First, a case where data in the chip set 4 is written into the COC DRAM 6a will be described. The chip set 4 outputs a protocol signal, including information such as a DQ signal and a CA signal, to the I/F LSI 12a. The I/F LSI 12a decodes the signal from the chip set 4 according to the protocol, and outputs a CA signal, a DQ signal, a CLK signal, and so on to the COC DRAM 6a. Then, the COC DRAM 6a writes the data in a predetermined address according to the signals output from the I/F LSI 12a.

When the data is to be written in the COC DRAM 6b, the I/F LSI 12a transmits a protocol signal to the I/F LSI 12b, and the I/F LSI 12b decodes the signal according to the protocol and outputs a CA signal, a DQ signal, a CLK signal, and so on to the COC DRAM 6b. As a result, as the COC DRAM 6a, the COC DRAM 6b writes the data in a predetermined address according to the signals output from the I/F LSI 12b.

Next, a case where data is read from the COC DRAM 6a will be described.

The chip set 4 supplies a protocol signal, including information such as a CA signal, to the I/F LSI 12a. The I/F LSI 12a decodes the signal from the chip set 4 according to the protocol and outputs a CA signal, a CLK signal, and so on to the COC DRAM 6a. The COC DRAM 6a responds to the CA signal and so on from the I/F LSI 12a and reads the data from a predetermined address. The I/F LSI 12a captures the read data and outputs the data as a protocol signal to the chip set 4.

When the data is to be read from the COC DRAM 6b, the chip set 4 supplies a protocol signal, including information such as a CA signal, to the I/F LSI 12b via the I/F LSI 12a. The I/F LSI 12b decodes the signal from the chip set 4 according to the protocol and outputs a CA signal, a CLK signal, and so on to the COC DRAM 6b. The COC DRAM 6b responds to the CA signal and so on from the I/F LSI 12b and reads the data from a predetermined address. The I/F LSI 12b captures the read data and outputs the data as a protocol signal to the chip set 4 via the I/F LSI 12a.

Next, the principle of the interposer 7 used in the system memory shown in FIGS. 2A and 2B will be described with reference to FIG. 3.

Figure 3:
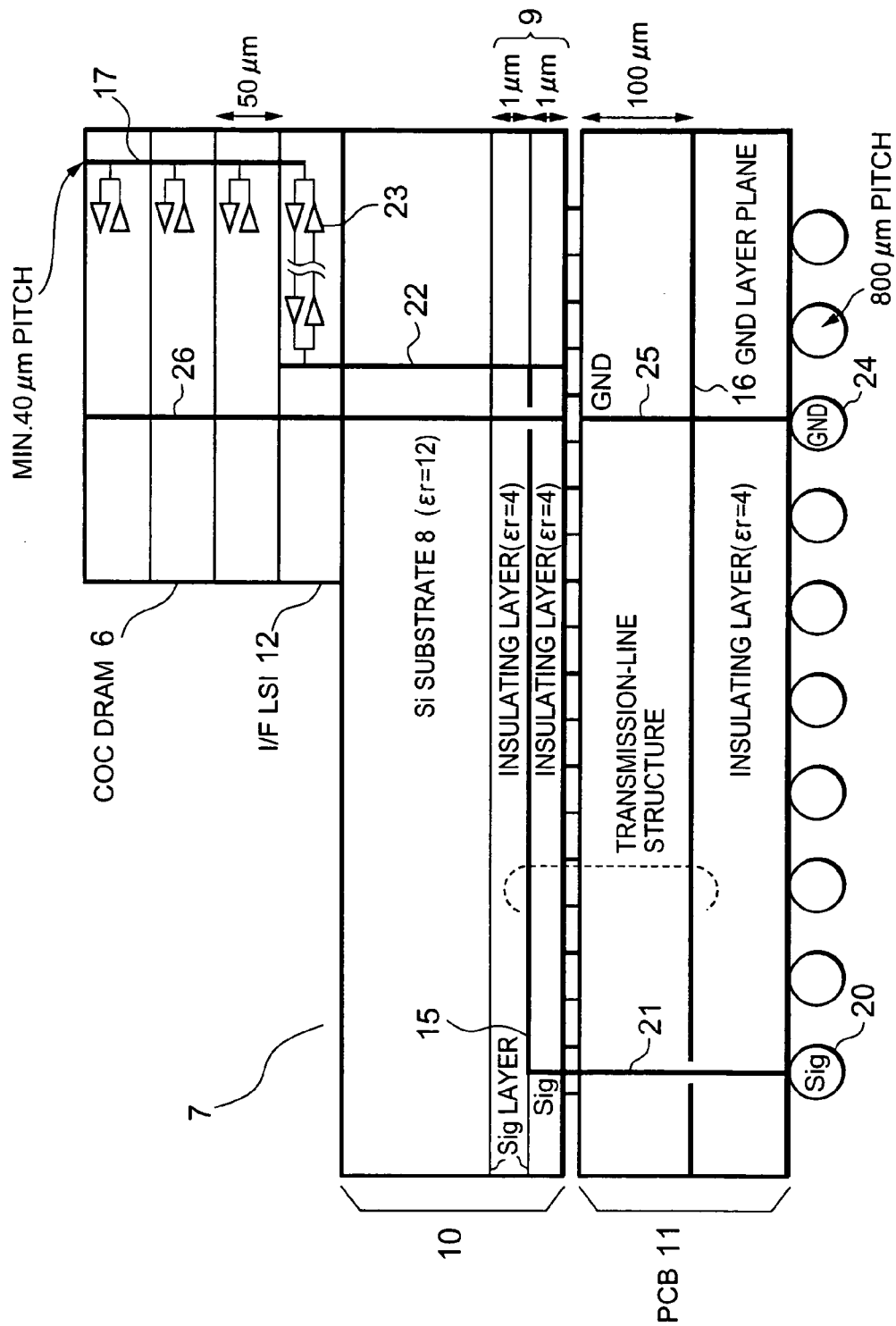
FIG. 3 shows the left half of a stacked DRAM used in the memory system shown in FIGS. 2A and 2B.

FIG. 3 is a cross-sectional view of the left half of the stacked DRAM 14 shown in FIGS. 2A and 2B.

As described above, the Si unit 10 of the interposer 7 includes the Si substrate 8 and the insulating-layer unit 9. The insulating-layer unit 9 includes a plurality of insulating layers each having a thickness of about 1 μm and wiring layers between the insulating layers. The wiring line 15 is formed by patterning the wiring layers in the insulating-layer unit 9. Also, the wiring line 15 is electrically connected to a connecting terminal disposed on the lower surface of the Si unit 10 via a blind via. The wiring line 15 has a width of 100 μm and a thickness of 0.5 μm, for example. Further, the Si unit 10 includes a through electrode 22 which is disposed through the Si substrate 8 and the insulating-layer unit 9 and which is connected to the wiring line 15. The insulating-layer unit 9 and the wiring line 15 of the Si unit 10 have a size which can be realized by an ordinary LSI manufacturing process, and thus are suitable for industrial production.

The reference plane 16 (GND layer plane) in the PCB 11 is disposed at a distance of about 100 μm from the upper surface of the PCB 11. The GND reference plane 16 forms a transmission-line structure together with the wiring line 15 of the Si unit 10. Because the distance between the GND reference plane 16 and the wiring line 15 is more than 100 μm, the characteristic impedance of this transmission-line structure is about 50 Ω. The DC resistance Rdc of the wiring line 15 is, assuming that the length thereof is 10 mm, $Rdc=(1/58e^{6})\times(10E^{-3})/((0.5e^{-6})\times(100e^{-6}))=3.4$ Ω. The resistance Rdc can be lowered by adjusting the thickness and width of the wiring line 15.

A plurality of solder balls are disposed on the lower surface of the PCB 11, at a pitch of about 800 μm. The solder balls are connected to and fixed to the motherboard 5, as described above.

A signal which has entered a solder ball 20 for a signal passes through a via 21 in the PCB 11 and enters the Si unit 10. Then, the signal is transmitted to a predetermined position under the I/F LSI 12 via the wiring line 15 running in the insulating-layer unit 9, and is then input to the I/F LSI 12 via the through electrode 22 which is disposed through the Si unit 10 and the I/F LSI 12. The signal which has entered the I/F LSI 12 passes a logic circuit 23 in the I/F LSI 12, and then reaches each DRAM chip via the through electrode 17 of the COC DRAM 6. A signal from each DRAM chip traces the opposite route and reaches the motherboard 5 via the solder ball 20.

A GND potential is supplied to a solder ball 24, enters the Si unit 10 via a via 25 in the PCB 11, and is supplied to each DRAM chip via a through electrode 26, which is disposed through the Si unit 10, the I/F LSI 12, and the COC DRAM 6. The GND potential is also supplied to the reference plane (GND layer plane) 16 in the PCB 11.

Next, the necessity of providing the PCB 11 in the interposer 7 will be described with reference to FIG. 4.

Figure 4:
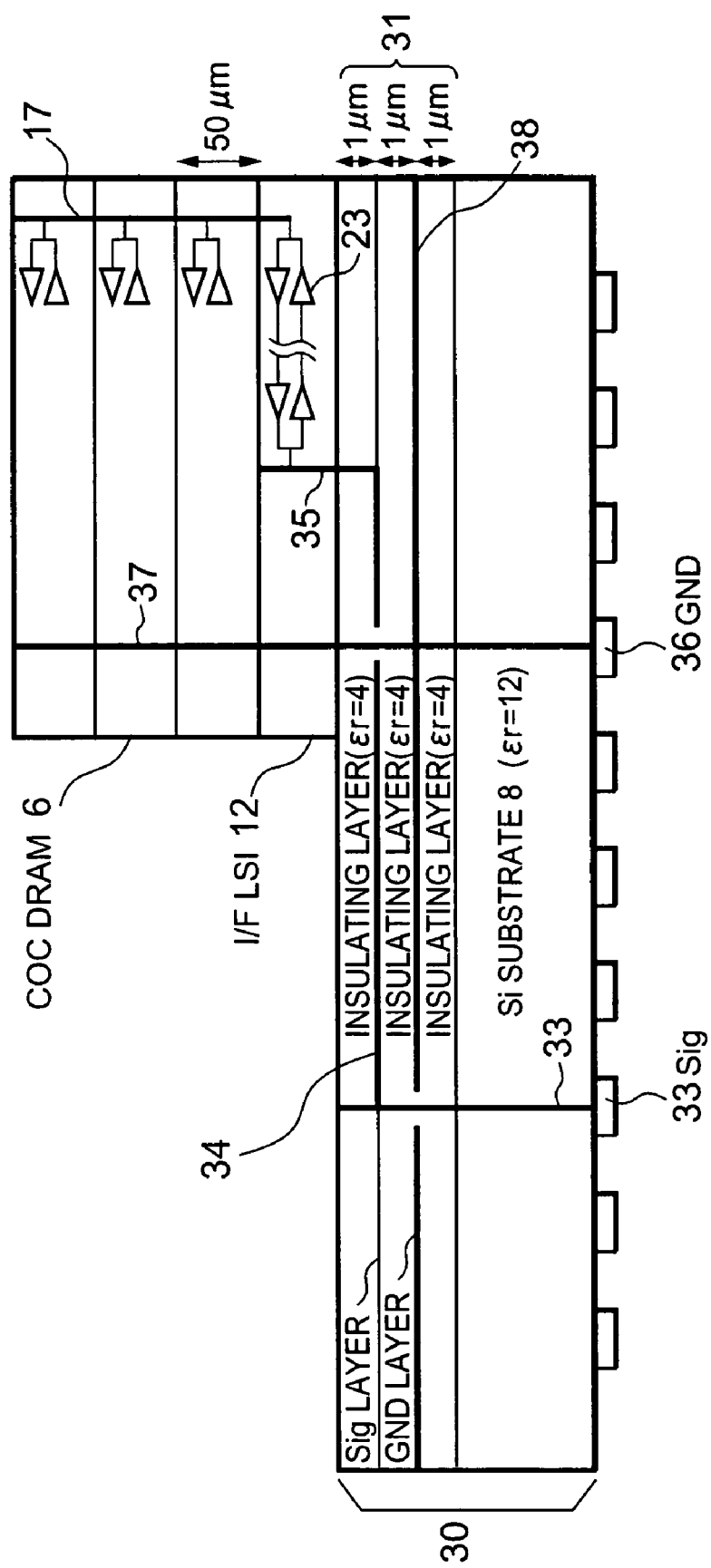
FIG. 4 is for explaining the reason of providing a PCB in an interposer in the memory system shown in FIGS. 2A and 2B.

FIG. 4 is a cross-sectional view of the left half of a stacked DRAM including an interposer which has only a Si unit 30.

The Si unit 30 includes the Si substrate 8 and an insulating-layer unit 31. The insulating-layer unit 31 includes a plurality of insulating layers each having a thickness of 1 μm, and a wiring line 34 and a GND layer plane 38 are disposed between the insulating layers. Each of the wiring line 34 and the GND reference plane 38 is disposed between different insulating layers.

Further, the Si unit 30 includes a through electrode 33 which is disposed through the Si substrate 8 and the insulating-layer unit 31 and which is connected to the wiring line 34, a through electrode 37 which is disposed through the Si substrate 8, the insulating-layer unit 31, and the COC DRAM 6 and which is connected to the GND reference plane 38, and a plurality of flip-chip electrodes on the lower surface of the Si unit 30.

A signal which has entered the Si unit 30 via a flip-chip electrode 32 for a signal passes the through electrode 33 in the Si unit 30 and the wiring line 34 running in the insulating-layer unit 31 and is input to a through electrode 35 in the I/F LSI 12. The signal entered the I/F LSI 12 passes a logic circuit 23 in the I/F LSI 12 and reaches the through electrode 17 of the COC DRAM 6, and is input to each DRAM chip. A signal from each DRAM chip toward the chipset 4 traces the opposite route and reaches the flip-chip electrode 32.

A GND potential is supplied to a flip-chip electrode 36, enters the Si unit 30, is supplied to the through electrode 37 which is disposed through the Si unit 30, the I/F LSI 12, and the COC DRAM 6, and is then supplied to each DRAM chip and the GND reference plane 38.

In the interposer shown in FIG. 4, the wiring line 34 forms a transmission-line structure in conjunction with the GND reference plane 38. In order to obtain a characteristic impedance of about 50 μl in this structure, the size of the wiring line 34 must be about 1 μm wide and 0.5 μm thick. In this case, however, the DC resistance Rdc of the wiring line 34 is, assuming that the length thereof is 10 mm, $Rdc=(1/58e^{6})\times(10e^{-3})/((0.5e^{-6})\times(1e^{-6}))=340$ Ω. This resistance is too large for a transmission line. That is, it is difficult to fabricate an interposer having a transmission-line structure which satisfies both of preferable DC resistance and characteristic impedance in a suitable size for industrial production by using only the Si unit.

When the insulating-layer unit is placed in the COC DRAM side and when the Si substrate is placed in the motherboard side as in the Si unit 30 shown in FIG. 4, by providing a PCB including a reference plate under the Si unit 30, a transmission-line structure having a favorable characteristic can be formed as in the interposer 7 shown in FIG. 3. In that case, however, since the Si substrate 8 which has a large relative permittivity εr (=12) is placed between the wiring line and the reference plane, the characteristic impedance is small if the size is the same as in FIG. 3.

Next, the interposer 7 will be described more specifically with reference to FIG. 5.

Figure 5:
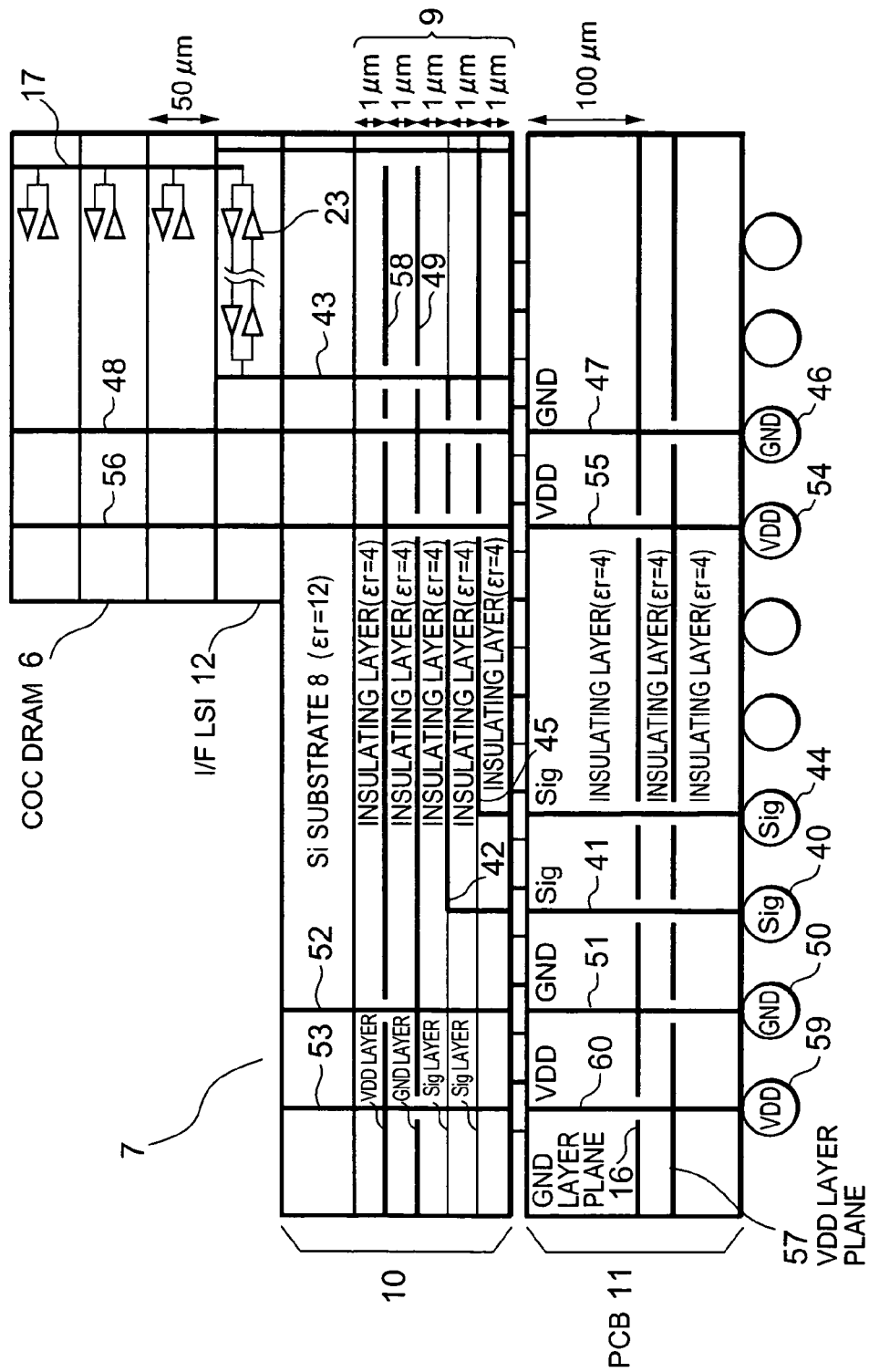
FIG. 5 specifically illustrates the configuration of the interposer used in the memory system shown in FIGS. 2A and 2B.

FIG. 5 shows a specific configuration of the interposer 7, and shows the cross-section of the left half of the stacked DRAM 14 as in FIG. 3. The points different from FIG. 3 are that the insulating-layer unit 9 of the Si unit 10 includes five insulating layers, that a VDD line, a GND line, and first and second signal lines are disposed between the insulating layers, and that through electrodes or vias connected thereto are provided.

In the interposer 7 shown in FIG. 5, a signal which has entered a solder ball 40 passes a via 41 in the PCB 11 and enters the Si unit 10. The signal entered the Si unit 10 is transmitted to a predetermined position under the I/F LSI 12 through a wiring line 42 running in the insulating-layer unit 9 and then reaches a through electrode 43 which is disposed through the Si unit 10 and the I/F LSI 12. Then, the signal enters the I/F LSI 12 via the through electrode 43, passes the logic circuit 23 in the I/F LSI 12, and then reaches each DRAM chip via the through electrode 17 in the COC DRAM 6. A signal from each DRAM chip traces the opposite route and reaches the solder ball 40.

Likewise, a signal which has entered a solder ball 44 reaches the COC DRAM 6 in the same way. However, this signal passes through a wiring line 45, which is disposed in a different wiring layer from that of the wiring line 42, which is used for transmitting the signal entered the solder ball 40. By providing the wiring lines 42 and 45 in different wiring layers, the number of wiring lines in each wiring layer can be reduced and the layout can be simplified.

Although not shown, a signal entered a solder ball under the I/F LSI 12 traces the same route. However, wiring provided in the insulating-layer unit 9 may be unnecessary depending on the position of the through electrode which is disposed through the Si unit 10 and the I/F LSI 12.

A GND potential supplied to a solder ball 46 enters the Si unit 10 via a via 47 in the PCB 11 and is supplied to each DRAM chip via a through electrode 48 which is disposed through the Si unit 10, the I/F LSI 12, and the COC DRAM 6. Also, the GND potential is supplied to the GND reference plane 16 in the PCB 11 and a GND reference line 49 in the Si unit 10.

A GND potential supplied to a solder ball 50, which is disposed under an area outside the I/F LSI 12 area, is supplied to the GND reference plane 16 via a via 51 in the PCB 11 and is also supplied to the GND reference line 49 via a through electrode 52 in the Si unit 10. Herein; a blind via may be used instead of the through electrode 52. However, when the through electrode 52 is used, a decoupling capacitor can be connected between the through electrode 52 and a through electrode 53, which will be described later. The decoupling capacitor can be disposed on the upper surface of the Si unit 10.

A VDD potential supplied to a solder ball 54 enters the Si unit 10 via a via 55 in the PCB 11 and is supplied to each DRAM chip via a through electrode 56 which is disposed through the Si unit 10, the I/F LSI 12, and the COC DRAM 6. Also, the VDD potential is supplied to a VDD plane 57 in the PCB 11 and to a VDD line 58 in the Si unit 10.

A VDD potential supplied to a solder ball 59, which is disposed under an area outside the I/F LSI 12 area, is supplied to the VDD plane 57 via a via 60 in the PCB 11 and is also supplied to the VDD line 58 via the through electrode 53 in the Si unit 10. Herein, a blind via may be used instead of the through electrode 53. However, by using the through electrode 53, a decoupling capacitor can be connected between the through electrode 53 and the through electrode 52 for GND potential, as described above.

The GND reference plane 16 in the PCB 11 is disposed at a distance of about 100 μm from the upper surface of the PCB 11. Each of the wiring lines 42 and 45 running in the insulating-layer unit 9 has a width of about 100 μm and a thickness of about 0.5 μm. Each insulating layer in the insulting-layer unit 9 has a thickness of about 1 μm. These wiring lines and insulating layers have size which can be realized in an ordinary LSI manufacturing process, and are thus suitable for industrial production.

The wiring lines 42 and 45 and the GND reference plane 16 form a transmission-line structure. The characteristic impedance of this structure is about 50Ω. On the other hand, the DC resistance Rdc of each of the wiring lines 42 and 45 is, assuming that the length thereof is 10 mm, $Rdc=(1/58e^{6})\times(10e^{-3})/((0.5e^{-6})\times(100e^{-6}))=3.4\Omega$. The DC resistance Rdc can be set at a smaller value by adjusting the thickness and width of each wiring line.

In FIG. 5, the GND reference plane 16 in the PCB 11 is positioned in the Si unit 10 side in relation to the VDD plane 57. Alternatively, the VDD plane 57 may be positioned in the Si unit 10 side, that is, above the GND plane 16. In that case, the VDD plane 57 serves as a reference plane for giving a potential reference to the wiring lines 42 and 45. That is, the wiring lines 42 and 45 forms a transmission-line structure in conjunction with the VDD reference plane 57.

Also, in the example shown in FIG. 5, the VDD line 58 and the GND line 49 are provided in the Si unit 10. These lines are provided for reinforcing power supply, and are not always necessary. Further, the VDD line 58 and the GND line 49 must be arranged so that they do not serve as the reference of the wiring lines 42 and 45 running in the insulating-layer unit 9. In other words, the VDD line 58 and the GND line 49 must not overlap the wiring lines 42 and 45 viewed from the above.

According to this embodiment, the entire part between the chip set 4 and the I/F LSI 12 connected by point-to-point connection can be a transmission-line structure, as described above. With this configuration, by matching the terminating resistance and source resistance with the characteristic impedance of the transmission line, signal integrity can be enhanced and transmission speed can be increased.

Also, according to this embodiment, the I/F LSI 12 is connected to the COC DRAM 6 via a through electrode in a short distance. Specifically, when eight DRAM chips, each having a thickness of 50 μm, are stacked, the distance is 0.4 mm. With this configuration, skew of each signal hardly occurs in the COC DRAM 6, so that a high-speed operation can be realized. Also, since the signal propagation time between the I/F LSI 12 and the COC DRAM 6 is shorter than rise time/fall time of a signal, the COC DRAM 6 can be used as a lumped-constant circuit. Therefore, a terminating resistor need not be provided in each DRAM chip of the COC DRAM 6 and thus power consumption by a terminating resistor does not occur, so that an operation at low power consumption can be realized.

Also, according to this embodiment, when the memory capacity of the DRAM should be increased, DRAM chips are three-dimensionally stacked instead of being aligned two-dimensionally. In this way, the memory capacity can be increased without increasing an occupied area. In this case, an increase in the height is about 50 μm per chip.

In the above-described embodiment, the reference plane is provided in the PCB 11. It is also possible in principle to provide the reference plane in the motherboard. In that case, the PCB 11 is not necessary, so that the Si unit 10 is directly connected to the motherboard 5 by flip-chip connection.

Next, the positional relationship of through electrodes which are disposed through the Si unit 10 of the interposer 7, the I/F LSI 12, and the COC DRAM 6 will be described with reference to FIGS. 6 and 7.

Figure 6:
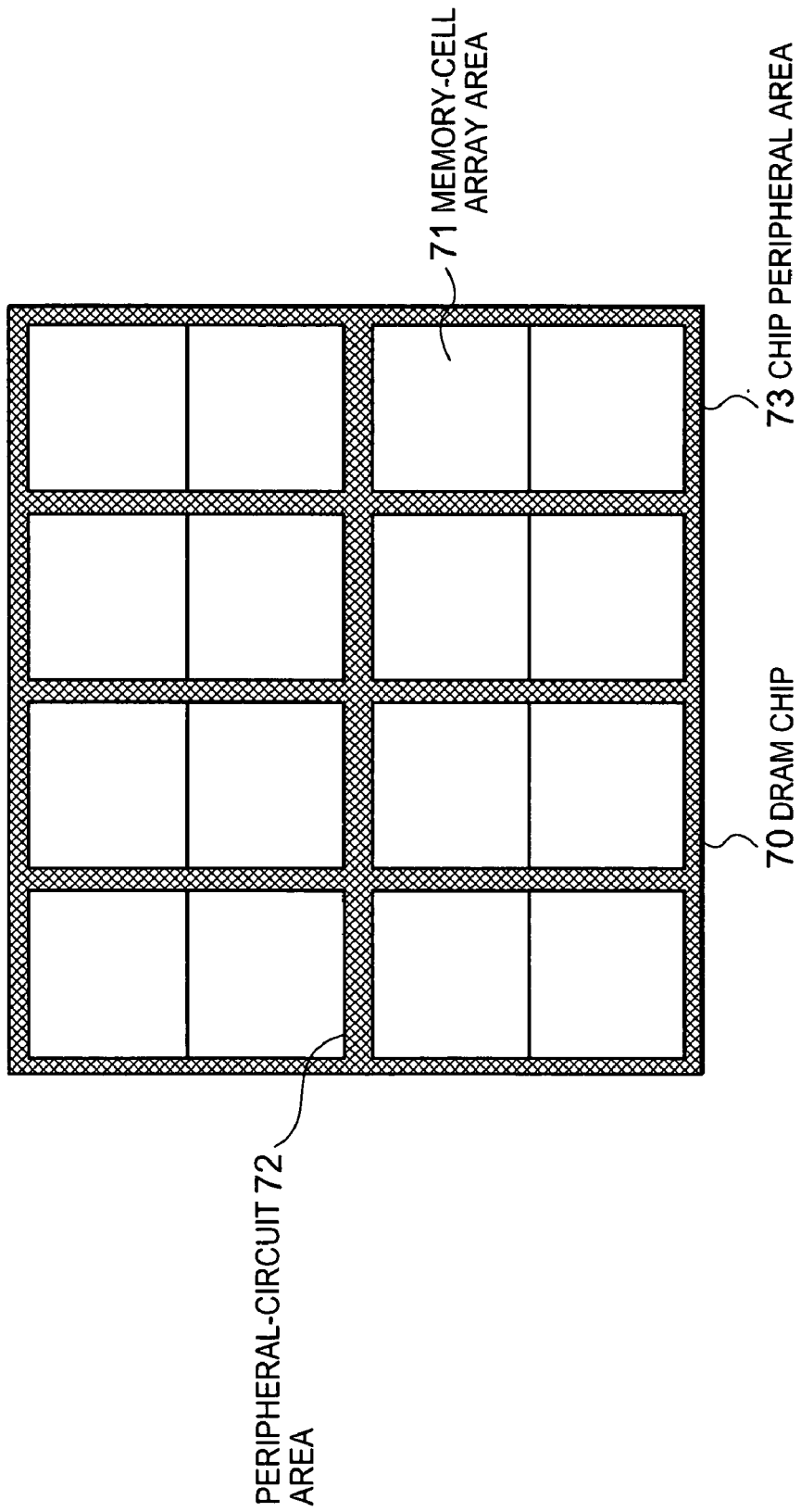
FIG. 6 illustrates an area where through electrodes can be disposed in a COC DRAM of the memory system shown in FIGS. 2A and 2B.

As shown in FIG. 6, the major part of an element formation area of a DRAM chip 70 is occupied by memory-cell array areas 71. Since many transistors are densely disposed in the memory-cell array areas 71, no through electrode can be disposed in these areas. An area in which a through electrode can be provided is limited to a peripheral-circuit area 72 (center-line area) between the memory-cell array areas 71 or a chip peripheral area 73 around the memory-cell array areas 71. Under the limitations, the through electrodes which are disposed through the Si unit 10 of the interposer 7, the I/F LSI 12, and the COC DRAM 6 are positioned in the manner shown in FIG. 7.

Figure 7:
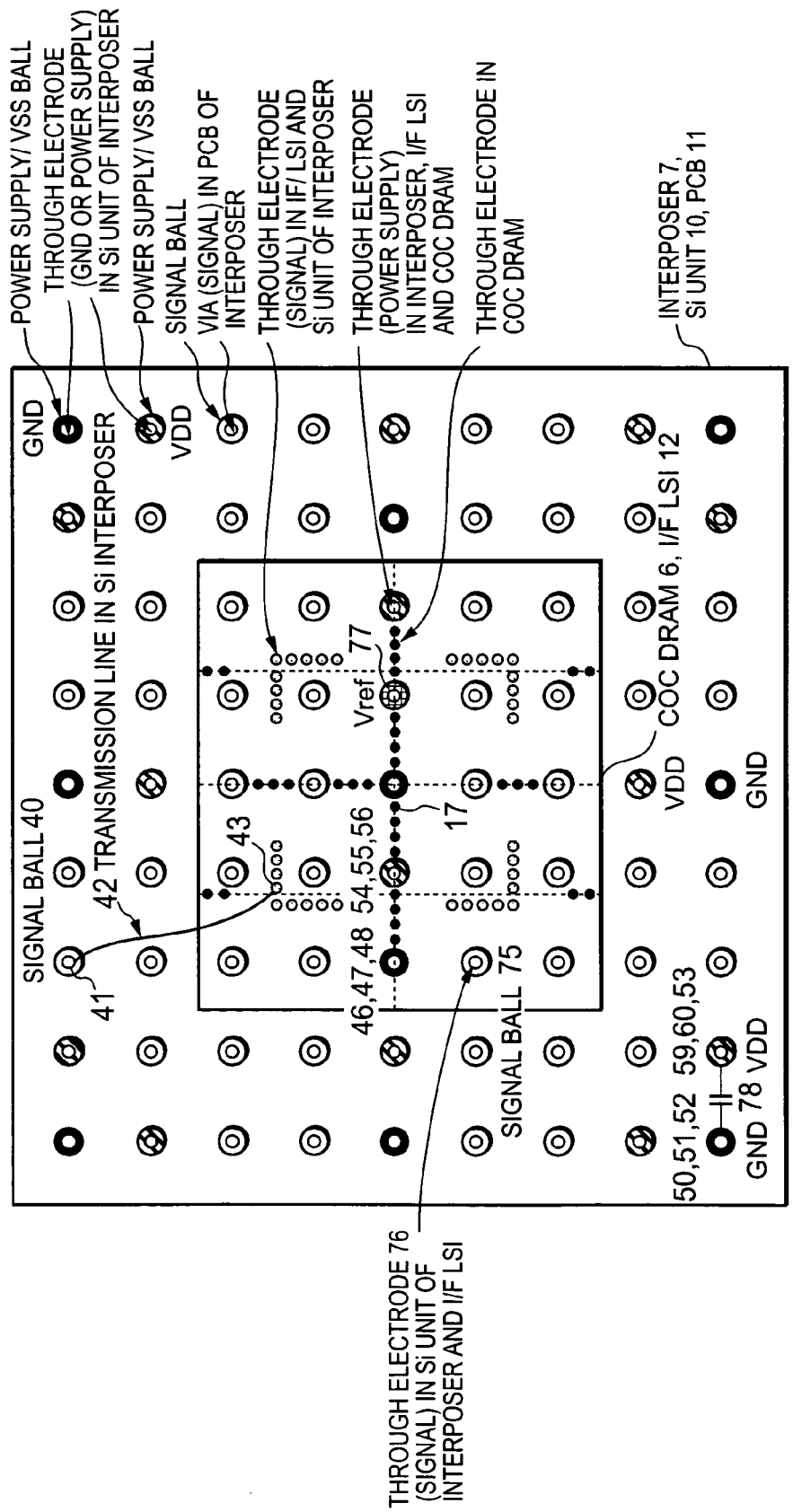
FIG. 7 illustrates the positional relationship of through electrodes disposed in an Si interposer, an I/F LSI, and a COC DRAM in the memory system shown in FIGS. 2A and 2B.

FIG. 7 is a plan perspective view showing the positions of the through electrodes which are disposed through the Si unit 10 of the interposer 7, the I/F LSI 12, and the COC DRAM 6. The number of through electrodes shown in this figure is smaller than that in the actual interposer 7. The parts which are the same as those in FIG. 5 are denoted by the same reference numerals.

In FIG. 7, the outermost large square corresponds to the interposer 7 (Si unit 10 and PCB 11) and the inner small square corresponds to the COC DRAM 6 and the I/F LSI 12.

In each of double circles arranged in a matrix pattern, the outer circle (bigger circle) represents a solder ball disposed on the lower surface of the interposer 7. Among these bigger circles, a white circle represents a solder ball for a signal, a black circle represents a solder ball for GND, and a hatched circle represents a solder ball for VDD or Vref.

The inner circle of each double circle and the other single circles (small circles) represent vias disposed in the PCB 11 and through electrodes disposed individually or in common through the Si unit 10, the I/F LSI 12, and the COC DRAM 6. Among the small circles, black circles represent through electrodes in the COC DRAM 6. On the other hand, the inner circles of the double circles basically represent the vias in the PCB 11 which are disposed immediately above the balls.

As described above with reference to FIG. 6, an area for disposing through electrodes in the COC DRAM 6 is limited to the peripheral-circuit area and the chip peripheral area of the DRAM chip. A through electrode which is disposed through the Si unit 10 of the interposer 7 and the I/F LSI 12 is placed so that the through electrode can be easily connected to the through electrode in the COC DRAM 6 and the via in the PCB 11 which correspond to each other.

A via in the PCB 11 disposed on a solder ball for a signal, which is disposed outside the small square, is connected to a through electrode which is disposed through the Si unit 10 and the I/F LSI 12 via a wiring line running in the insulating-layer unit 9 of the Si unit 10 of the interposer 7. A through electrode which is disposed through the I/F LSI 12 is connected to a through electrode which is disposed through the COC DRAM 6 via the internal circuit 23. For example, the via 41 in the PCB 11, which is disposed on the solder ball 40, is connected to the through electrode 43 which is disposed through the Si unit 10 and the I/F LSI 12 via the wiring line 42. Further, the through electrode 43 is connected to the through electrode 17 in the COC DRAM 6 via the internal circuit of the I/F LSI 12. In this way, by providing the through electrodes of the COC DRAM 6 in the peripheral-circuit area and the chip peripheral area outside the memory-cell array areas, the DRAM chips can be efficiently laid out.

If a through electrode 76, which is disposed through the Si unit 10 and the I/F LSI 12, exists immediately above a via in the PCB 11 disposed on a solder ball 75 for a signal inside the small square, the via is directly connected to the through electrode 76 by bypassing the wiring line running in the insulating-layer unit 9. On the other hand, a via in the PCB 11 above which a through electrode in the Si unit 10 does not exist is connected to a through electrode which is disposed through the Si unit 10 and the I/F LSI 12 via the wiring line running in the insulating-layer unit 9, as the via which is placed on a solder ball outside the small square.

The via 47 in the PCB 11, which is disposed on the solder ball 46 for a GND potential positioned inside the small square, is connected to the immediately above through electrode 48 which is disposed through the Si unit 10, the I/F LSI 12, and the COC DRAM 6 by bypassing the wiring line in the insulating-layer unit 9.

Likewise, the via 55 in the PCB 11, which is disposed on the solder ball 54 for a VDD potential, is connected to the immediately above through electrode 56 which is disposed through the Si unit 10, the IF/LSI 12, and the COC DRAM 6, by bypassing the wiring line in the insulating-layer unit 9. This is the same for the via disposed on a solder ball 77 for a Vref potential.

The via 51 in the PCB 11, which is disposed on the solder ball 50 for a GND potential outside the small square, is directly connected to the through electrode 52 which is disposed immediately above the via 51 through the Si unit 10.

Likewise, the via 60 in the PCB 11, which is disposed on the solder ball 59 for a VDD potential, is directly connected to the through electrode 53 which is disposed immediately above the via 60 through the Si unit 10.

As described above, by placing the vias in the PCB 11 and the through electrodes which are disposed through the Si unit 10, the I/F LSI 12, and the COC DRAM 6 immediately above the solder balls for GND and VDD in the area under the I/F LSI 12 (inside the small square), GND and VDD potentials can be supplied to each DRAM chip in the shortest distance. Further, the vias in the PCB 11 and the through electrodes which are disposed through the Si unit 10 are placed immediately above the solder balls for GND and VDD outside the area under the I/F LSI 12 (outside of the small square), so that GND and VDD potentials are supplied to the COC DRAM 6 via the GND plane and the VDD plane in the PCB 11 and the GND line and the VDD line in the Si unit 10. Accordingly, electric power can be stably supplied to each DRAM chip.

Further, by providing the VDD-potential through electrode 53 and the GND-potential through electrode 52, which are disposed through the Si unit 10, in the outside of the area under the I/F LSI 12, a decoupling capacitor 78 can be connected therebetween. By using the decoupling capacitor, electric power can be supplied to the COC DRAM 6 more stably. The decoupling capacitor can be provided in another position.

Figure 8:
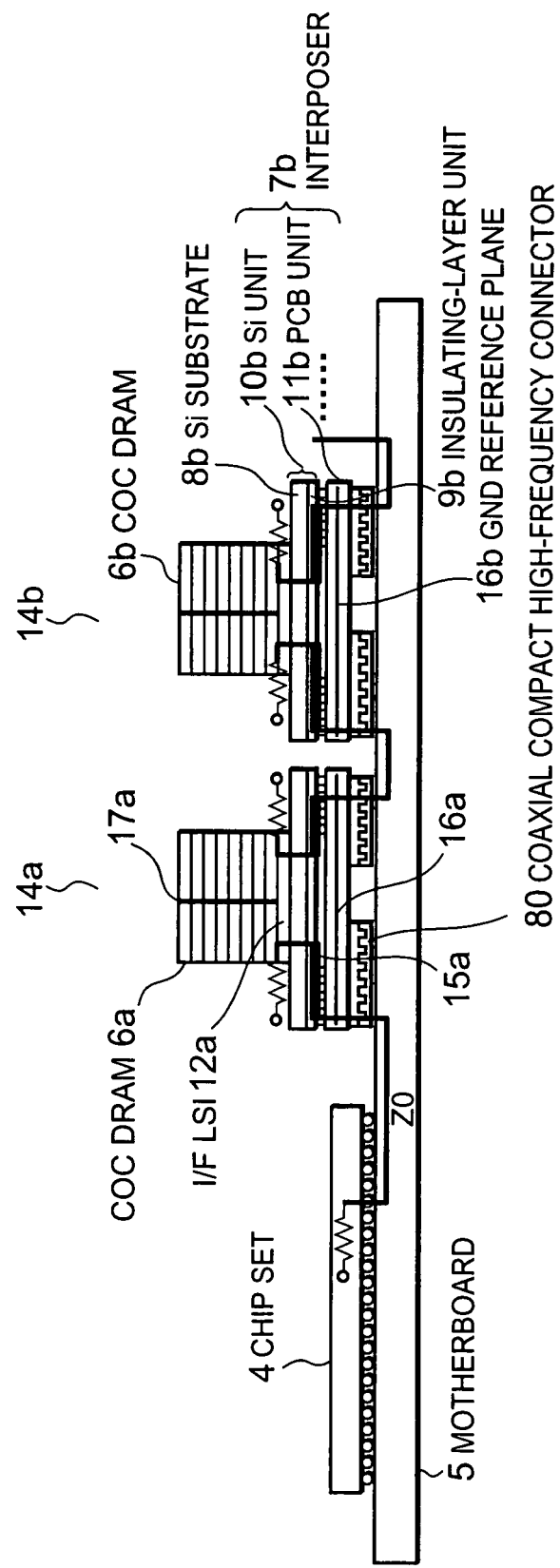
FIG. 8 shows the configuration of a memory system according to a second embodiment of the present invention.

FIG. 8 is a schematic view showing the configuration of a memory system according to a second embodiment of the present invention. In FIG. 8, parts which are the same as those in FIGS. 2A and 2B are denoted by the same reference numerals.

The basic configuration of the memory system according to the second embodiment is the same as that in the first embodiment. The difference between these embodiments is that coaxial compact high-frequency connectors 80 are used instead of solder balls for connecting the PCB 11 and the motherboard 5. By using the connectors, the high-speed performance can be further enhanced.

Next, a method for placing the I/F LSI 12, which is common to the memory systems according to the first and second embodiments, will be explained with reference to FIGS. 9A and 9B.

Figures 9A, 9B:
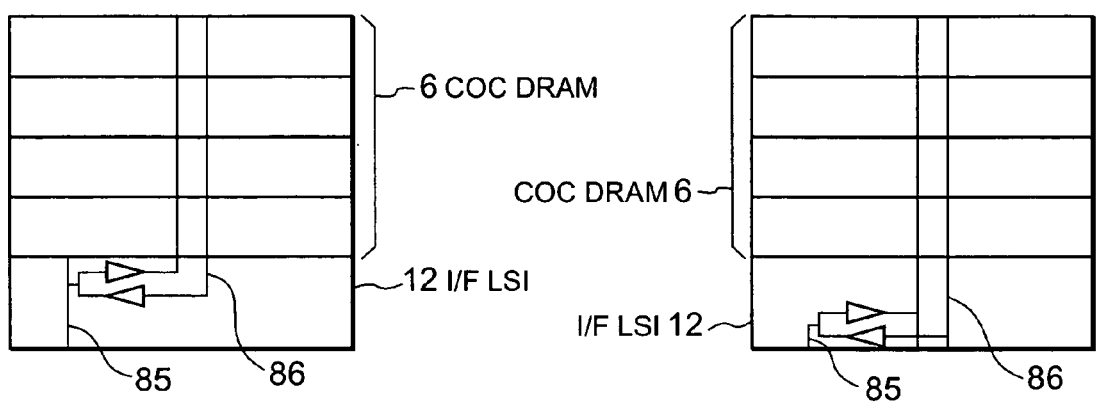

As will be understood from FIGS. 9A and 9B, when the number of signals 85 (in this case, 1) input/output to/from the I/F LSI 12 through its lower surface is different from the number of signals 86 (in this case, 2) input/output to/from the I/F LSI 12 through its upper surface, the number of through electrodes which must be provided in the I/F LSI 12 varies depending on whether the I/F LSI 12 is placed face up or face down. That is, when the number of signals 86 input/output through the upper surface is larger than the number of signals 85 input/output through the lower surface, the I/F LSI 12 should be placed face up as shown in FIG. 9A, so as to reduce the number of through electrodes. Herein, a face-up placement means that the I/F LSI 12 is placed such that the transistor-formed area of the I/F LSI 12 is directed upward (the side of COC DRAM 6).

In the memory system according to the first and second embodiments, the number of signals input/output to/from the I/F LSI 12 through the upper surface is larger than the number of signals input/output through the lower surface. Therefore, by placing the I/F LSI 12 face up, the number of through electrodes can be reduced. Accordingly, manufacture yield ratio can be improved.

Figure 10B:
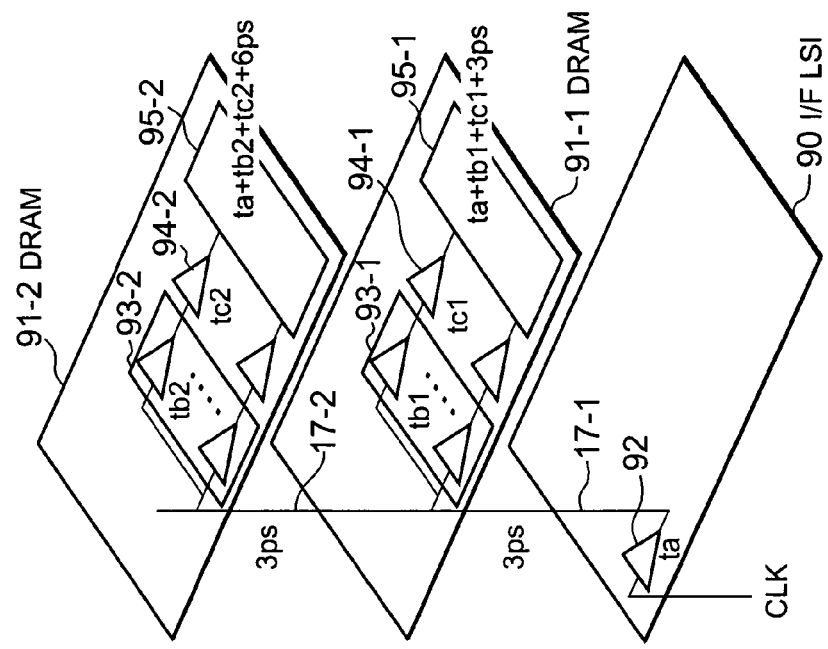
Figure 10A:
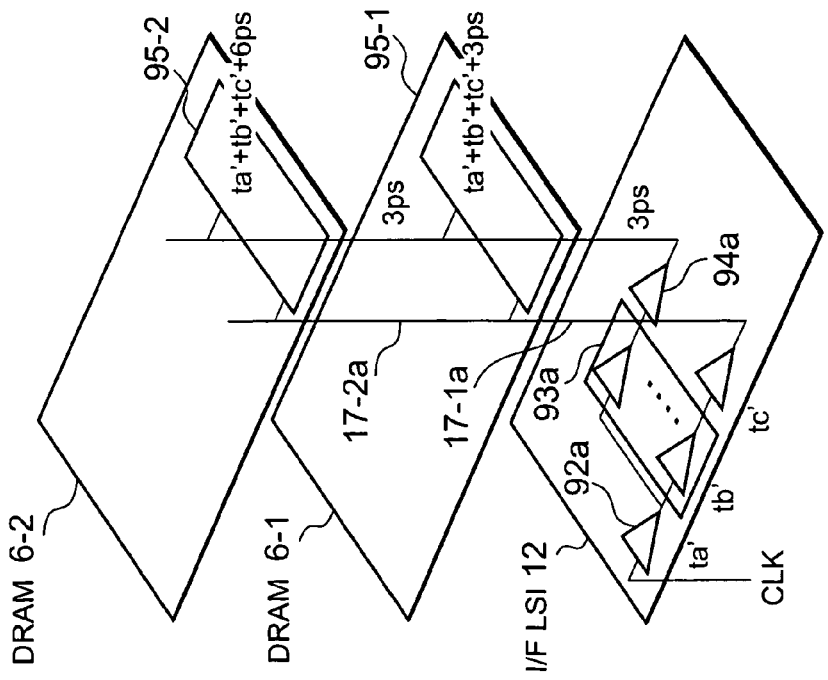

FIG. 10A shows an example of the configuration of the I/F LSI 12 used in the memory system according to the first and second embodiments. FIG. 10B shows an example of the configuration of a typical (or commonly used) I/F LSI.

The typical I/F LSI 90 shown in FIG. 10B receives a CLK (or clock signal), which is input from the lower side, by a buffer 92, and supplies the CLK via through electrodes 17-1 and 17-2 to DRAM chips 91-1 and 91-2.

In the DRAM chip 91-1, a CLK distributing circuit 93-1 distributes the CLK to the chip, and a buffer 94-1 supplies the distributed CLK to a flip-flop group 95-1. Likewise, in the DRAM chip 91-2, a CLK distributing circuit 93-2 distributes the CLK to the chip, and a buffer 94-2 supplies the distributed CLK to a flip-flop group 95-2.

Herein, delay time of the buffer 92 is ta, delay time of the CLK distributing circuit 93-1 is tb1, delay time of the buffer 94-1 is tc1, delay time of the CLK distributing circuit 93-2 is tb2, and delay time of the buffer 94-2 is tc2. Further, delay time of one chip in a through electrode is 3 ps. Under this condition, the time period required by the CLK to reach the flip-flop group 95-1 after entering the I/F LSI 90 is represented by ta+tb1+tc1+3 ps. On the other hand, the time period required by the CLK to reach the flip-flop group 95-2 after entering the I/F LSI 90 is represented by ta+tb2+tc2+6 ps. The difference between these time periods is obtained by calculating (tb2−tb1)+(tc2−tc1)+3 ps. The time difference includes characteristic variation of the CLK distributing circuit 93 and the buffer 94 in the DRAM chips.

On the other hand, in the I/F LSI 12 shown in FIG. 10A, a buffer 92a receives a CLK input from the lower side, a CLK distributing circuit 93a distributes the CLK to the chip, and a buffer 94a outputs the distributed CLK to a through electrode 17-1a. The through electrode 17-1a supplies the CLK from the buffer 94a to a DRAM chip 6-1 and a through electrode 17-2a, and the through electrode 17-2a supplies the CLK to a DRAM chip 6-2. The CLK supplied to the DRAM chips 6-1 and 6-2 is supplied to flip-flop groups 95-1 and 95-2.

As described above, the I/F LSI 12 shown in FIG. 10A includes the CLK distributing circuit 93a and the buffer 94a required for each DRAM chip in common, so that the structure of each DRAM chip can be simplified.

Herein, delay time of the buffer 92a is ta', delay time of the CLK distributing circuit 93a is tb', delay time of the buffer 94a is tc', and delay time of one chip in a through electrode is 3 ps. Under this condition, the time period required by the CLK to reach the flip-flop group 95-1 after entering the I/F LSI 12 is represented by ta'+tb'+tc'+3 ps, and the time period required by the CLK to reach the flip-flop group 95-2 is represented by ta'+tb'+tc'+6 ps. The difference therebetween is constant at 3 ps.

In this way, by using the I/F LSI 12 shown in FIG. 10A, the time difference of CLK input to the flip-flop groups 95-1 and 95-2 in each DRAM chip can be constant. That is, in the I/F LSI 12 shown in FIG. 10A, CLK can be distributed without being affected by the characteristic variations of the COC DRAM 6. Therefore, such I/F LSI can be effectively used for transmitting a CLK signal, in which occurrence of variation is not desirable.

Figures 11A, 11B:
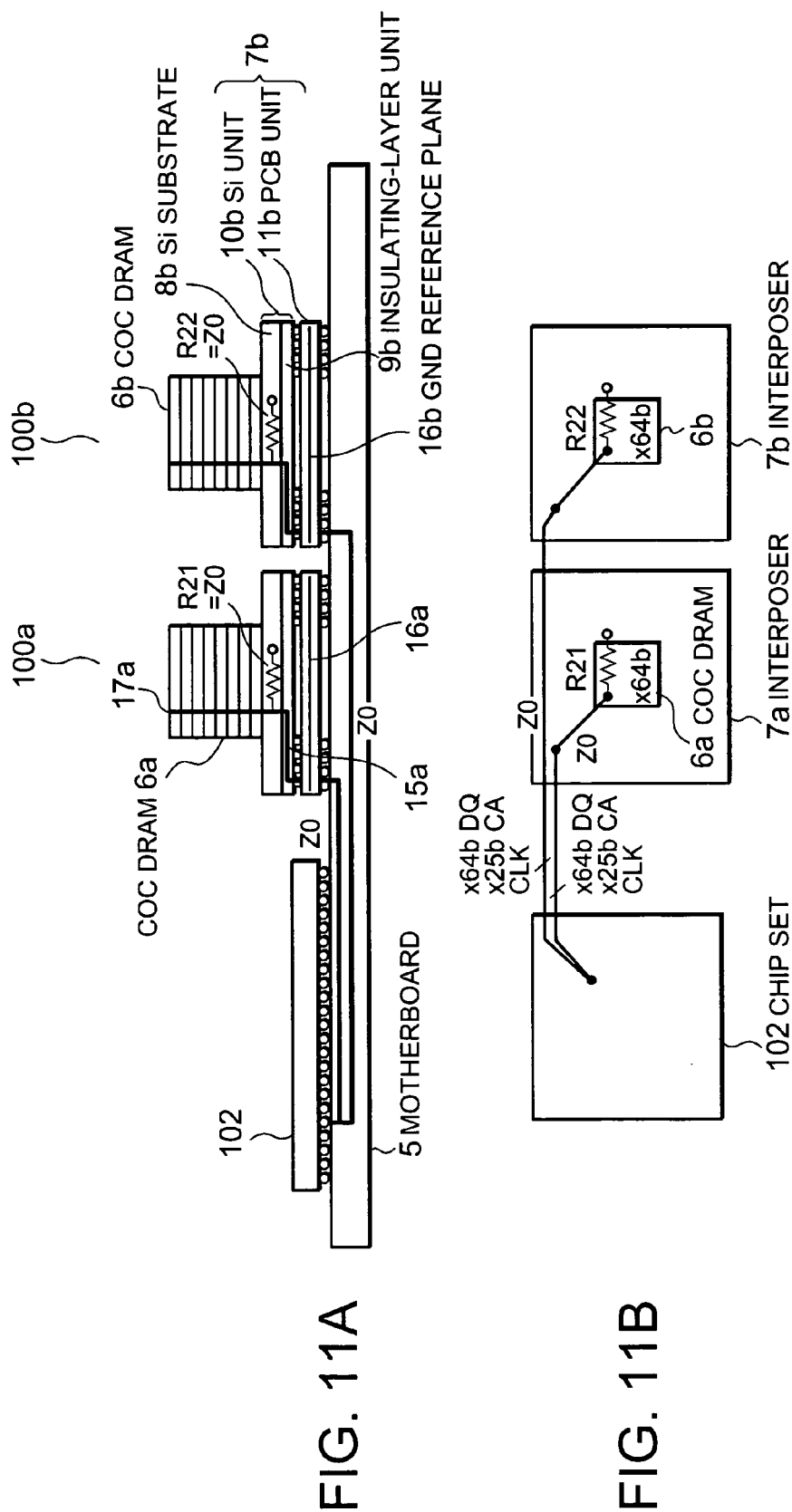

Next, a memory system according to a third embodiment of the present invention will be described with reference to FIGS. 11A and 11B. In FIGS. 11A and 11B, parts which are the same as those in FIGS. 2A and 2B are denoted by the same reference numerals.

The difference between the memory system shown in FIGS. 11A and 11B and that in FIGS. 2A and 2B is that each of stacked DRAMs 100 does not include the I/F LSI 12 and that a chip set 102 and the stacked DRAMs 100 are connected by a kind of point-to-point connection (one to plurality connection). That is, in the memory system according to the third embodiment, each of the stacked DRAMs 100 includes the COC DRAM 6 and the interposer 7, and a corresponding ball of all the stacked DRAM 100 is connected to each ball under the chip set 102. The chip set 102 and the COC DRAM 6 directly transmit/receive signals without using the I/F LSI 12.

The characteristic impedance of each signal line for connecting the chip set 102 and the stacked DRAM 100 is set at Z0. Further, a terminating resistor is connected to each signal line. The terminating resistor will be described later together with the operation of this memory system.

Signals transmitted/received between the chip set 102 and the stacked DRAM 100 include DQ and DQS signals, which are bidirectional signals, and CA and CLK signals, which are unidirectional signals. These signals are directly transmitted/received between the chip set 102 and the DRAM 100 and are not so-called protocol signals. The data rate of the signals is 1.6 Gbps when the data rate of the DRAM is 1.6 Gbps. The stacked DRAM should preferably have a x64 bits structure when 1 channel is 8 bytes. FIGS. 11A and 11B show a case of one-channel structure.

Next, the operation of the memory system of this embodiment and a method for providing a terminating resistor (method of termination) will be described.

First, a case where data in the chip set 102 is written into the COC DRAM 6a will be described.

Assume that a DQ signal of 64 bits and a CA signal of about 25 bits are output from the chip set 102. At this time, since one of the balls of the chip set 102 is connected to the two COC DRAMs 6a and 6b, the same signal is input to the COC DRAMs 6a and 6b. Then, the chip set 102 outputs a control signal to the COC DRAM 6a and 6b from other independent balls. As a result, the COC DRAM 6a captures the DQ signal and so on from the chip set 102, but the COC DRAM 6b does not capture the signals.

Each signal line is terminated by providing far-end terminators to both stacked DRAMs 100a and 100b. The far-end terminator is provided in the COC DRAM 6. The far-end terminator may be provided in each DRAM chip or in the top DRAM chip. By providing the terminator in the stacked DRAM, ON/OFF operation of a terminating resistor can be easily controlled.

Alternatively, the far-end terminator may be provided in the Si unit 10 of the interposer 7. In that case, several MOS transistors must be provided in the Si unit 10. Only the COC DRAM 6 is connected from the far-end terminator onward in the signal line, and the length of the wiring is about 0.4 mm. Therefore, the signal integrity is not substantially degraded. Also, a terminating resistor need not be provided in the DRAM, so that the load for the DRAM is small and heat can be easily emitted.

Alternatively, the far-end terminator may be provided in the PCB 11 of the interposer 7. In that case, only the Si unit 10 of the interposer 7 and the COC DRAM 6 are connected from the far-end terminator onward in the signal line, and the wiring length is about 0.5 mm. Therefore, the signal integrity is not substantially degraded. Also, a terminating resistor need not be provided in the DRAM, so that the load for the DRAM is small and heat can be easily emitted. In this case, it is difficult to allow a terminating resistor to be turned OFF. However, problems do not arise if an open-drain driver is used as an output driver of the COC DRAM 6 at a reading operation.

Likewise, the data in the chip set 102 may be written into the COC DRAM 6b in the same manner as described above.

Next, a case where data is read from the COC DRAM 6a will be described.

First, a CA signal and so on are supplied from the chip set 102 to the COC DRAM 6a. The CA signal and so on are also supplied to the COC DRAM 6b as in the writing operation, but a control signal prevents the COC DRAM 6b from capturing the signals. The COC DRAM 6a decodes the signals supplied from the chip set 102 and reads data from a corresponding address. The data read from the COC DRAM 6a is transmitted to the chip set 102 and is captured therein. Also, the data transmitted to the chip set 102 is transmitted to the side of the COC DRAM 6b via a ball of the chip set 102. Therefore, a terminator must be provided in the COC DRAM 6b side. Desirably, the ON resistance of the driver of the COC DRAM 6a is set to Z0. When the driver of the COC DRAM 6a is push-pull type, terminator on the COC DRAM 6a side shown in FIGS. 11A and 11B is not necessary.

Likewise, the data can be read from the COC DRAM 6b in the same manner as described above.

According to the memory system of this embodiment, the same advantages as those in the memory system shown in FIGS. 2A and 2B can be obtained. Further, the memory system of this embodiment does not include an I/F LSI, and thus the power consumption and cost are lower than the memory system shown in FIGS. 2A and 2B. Further, the number of balls of the chip set 102 can be reduced.

Next, a memory system according to a fourth embodiment of the present invention will be described with reference to FIGS. 12A and 12B.

Figures 12A, 12B:
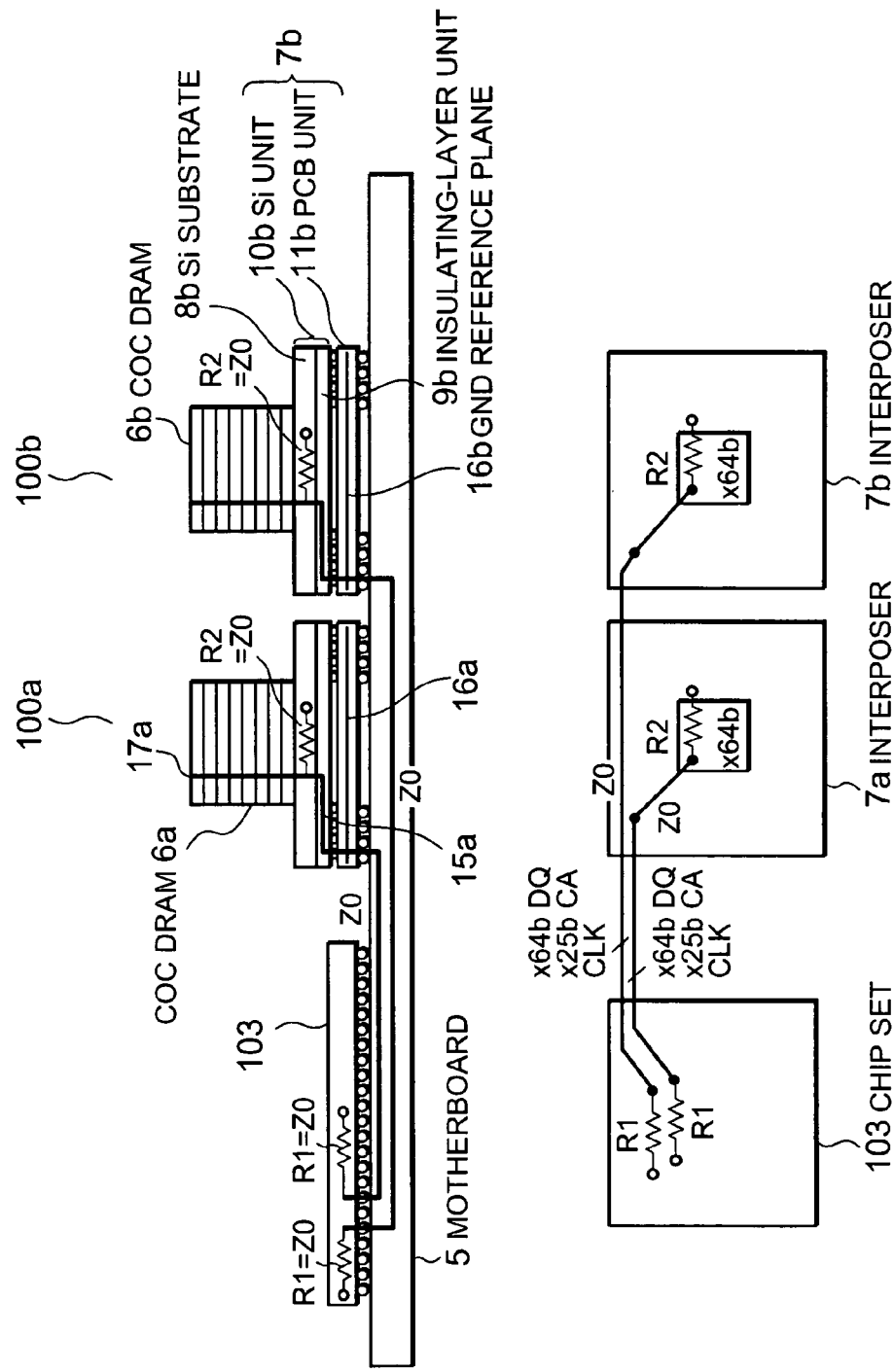

The memory system shown in FIGS. 12A and 12B is basically the same as the memory system shown in FIGS. 11A and 11B, but is different in that a chip set 103 and each COC DRAM 6 transmit/receive signals in a one-to-one relationship. That is, the chip set 103 includes a terminal for the COC DRAM 6a and a terminal for the COC DRAM 6b.

A signal line is connected between one of the balls of the chip set 103 and the stacked DRAM 100a including the COC DRAM 6a and the interposer 7a, and another signal line is connected between another signal ball and the stacked DRAM 100b including the COC DRAM 6b and the interposer 7b. Signals transmitted therebetween include bidirectional signals such as DQ and DQS signals and unidirectional signals such as CA and CLK signals. These signals are directly transmitted/received between the chip set 103 and the stacked DRAM 100 and are not so-called protocol signals.

The chip set 103 and the stacked DRAMs 100a and 100b are connected by point-to-point connection, and the characteristic impedance of the entire lines is set to Z0. The data rate of a signal is 1.6 Gbps if the data rate of the DRAM is 1.6 Gbps. The stacked DRAM should preferably have a +64 bits structure when 1 channel is 8 bytes. The memory system shown in FIGS. 12A and 12B is of a 2-channel structure.

Next, the operation of the memory system shown in FIGS. 12A and 12B and a method for providing a terminating resistor will be described.

First, a case where data in the chip set 103 is written into the COC DRAM 6a will be described. A DQ signal of 64 bits and a CA signal of about 25 bits are output from the chip set 103.

When the signal line should be terminated, a far-end terminator is provided in the stacked DRAM 100a. As described above with reference to FIGS. 11A and 11B, three places can be considered as a place for providing the far-end terminator. Preferably, the ON resistance of the driver of the chip set 103 is matched with the characteristic impedance of the transmission line.

Likewise, the data in the chip set 103 can be written into the COC DRAM 6b in the same manner as described above. In this case, the COC DRAMs 6a and 6b can operate independently. That is, a 2-channel operation can be realized.

Next, a case where data is read from the COC DRAM 6a will be described. A CA signal and so on are supplied from the chip set 103 to the COC DRAM 6a. The COC DRAM 6a decodes the signals and reads data from a corresponding address. The read data is transmitted to the chip set 103 and is captured therein. Therefore, a terminating resistor is provided in the chip set 103. Preferably, the ON resistance of the driver of the COC DRAM 6a is set to Z0. If the driver of the COC DRAM 6a is a push-pull driver, the terminator in the COC DRAM 6a side shown in FIGS. 12A and 12B is not necessary.

Likewise, data can be read from the COC DRAM 6b in the same manner as described above.

According to the memory system of this embodiment, the same advantages as those in the memory system shown in FIGS. 11A and 11B can be obtained. Further, since a two-channel operation can be performed, the system performance can be enhanced.

Figures 13A, 13B:
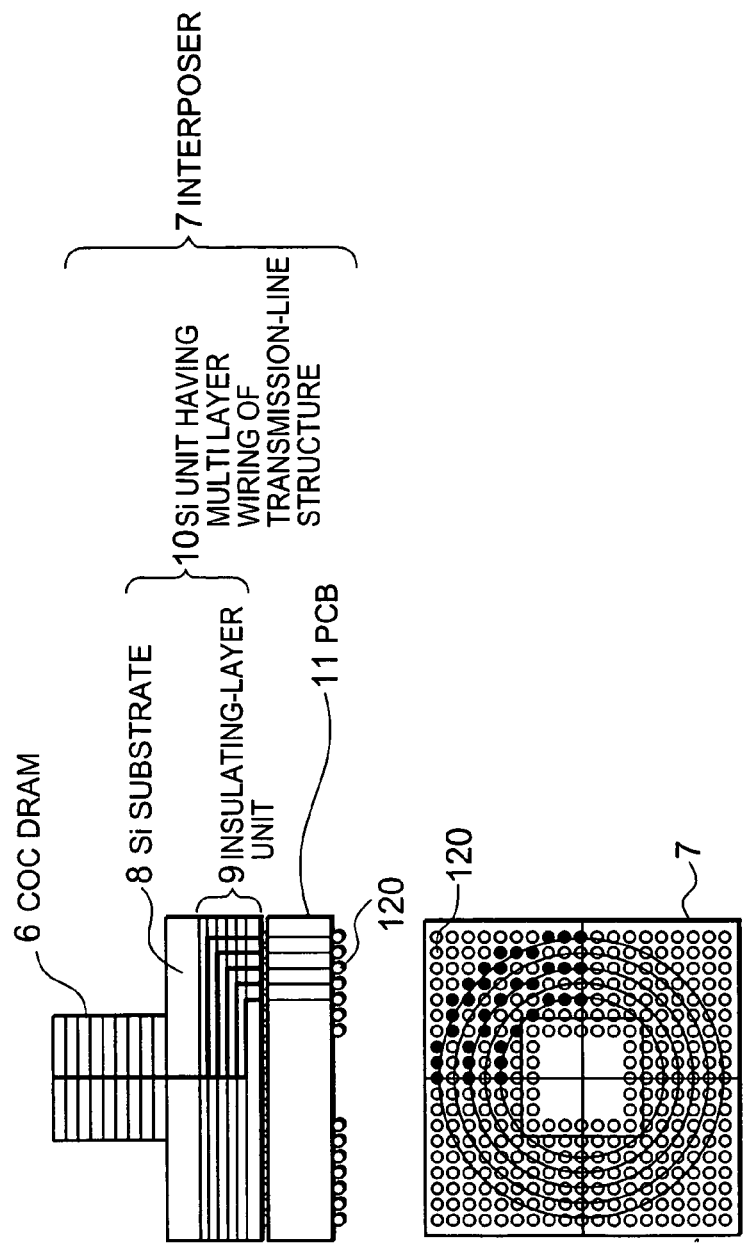

FIGS. 13A and 13B illustrate an example of assignment of signals to solder balls 120 of the interposer 7 in the memory system shown in FIGS. 11A and 11B and FIGS. 12A and 12B. FIG. 13A is a cross-sectional view of the stacked DRAM 100 and FIG. 13B is a plan perspective view. The number of wiring layers in the interposer 7 is determined by considering the density of wiring.

In the system structure shown in FIGS. 11A and 11B and FIGS. 12A and 12B, signals are transmitted/received between the chip set and the COC DRAM 6 by type of signals such as DQ and CA signals, and thus the skew of each signal should be small. Therefore, by making the time period after a signal enters the interposer 7 until the signal reaches the COC DRAM 6 constant in each type of signal, high-speed operation can be promoted. In order to achieve this, signals of the same attribute are assigned to balls on concentric circles (or the vicinity of the circles), the center of the circles being the center of the interposer 7. For example, in FIG. 13B, DQ signals are assigned to the balls indicated by black circles along the largest circle, and DQS signals for capturing DQ signals are assigned to the balls indicated by white circles along the next inner circle. Also, CA signals and CLK signals for capturing CA signals are assigned to the balls indicated by black circles along the inner circle next to the circle for the DQS signals. In this way, by assigning signals to the balls of the interposer 7, the delay time of signals output from the chip set 102 or 103 and input to the balls of the interposer 7 can be made constant in each type of signals, and thus the signals can be transmitted/received between the chip set 102 or 103 and the COC DRAM 6 with a small skew.

Figure 14:
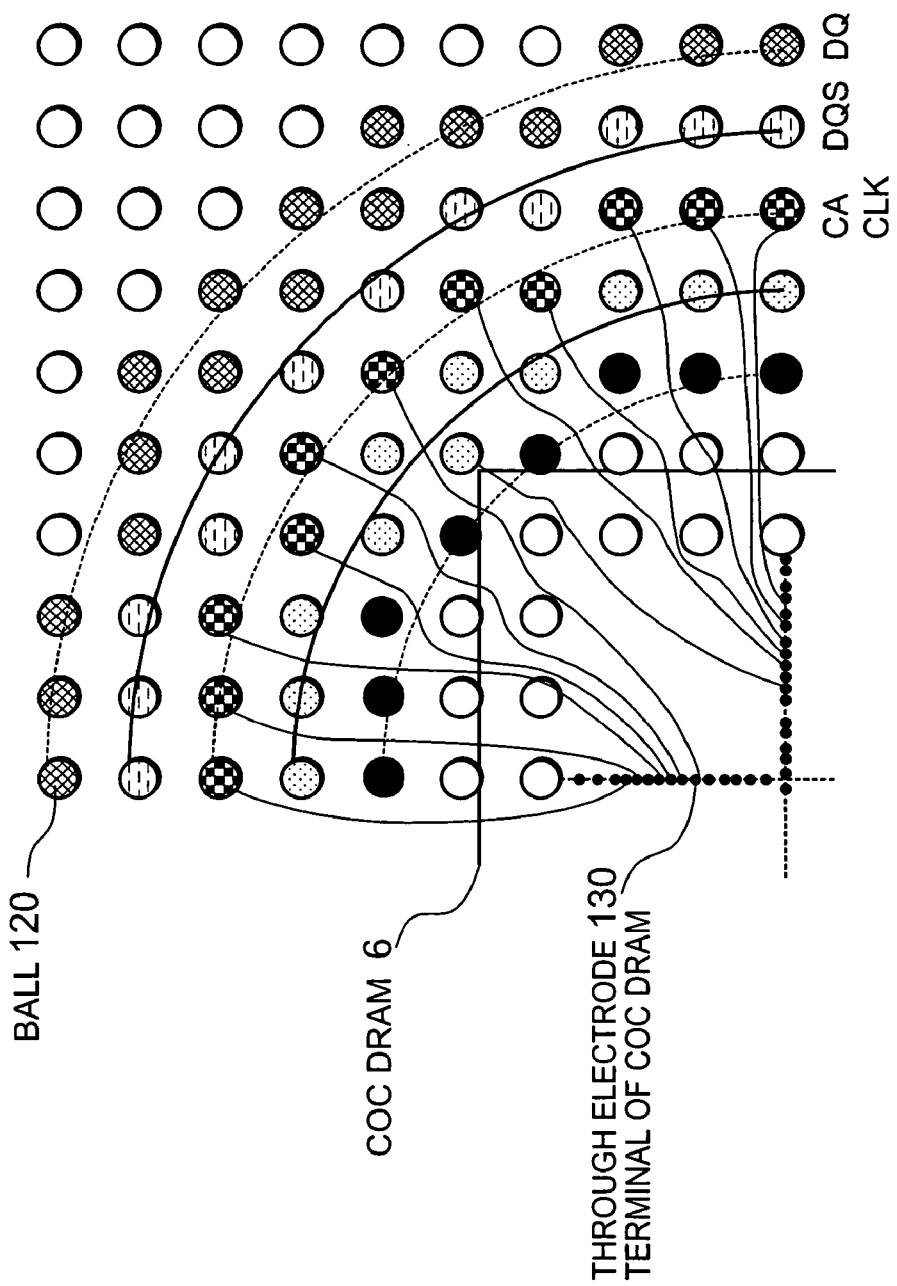
FIG. 14 specifically illustrates the upper right portion of FIG. 13B, which shows the assignment of signals to balls of the interposer and the connection between the balls and through electrode terminals of a COC DRAM.

FIG. 14 is an enlarged view of the upper right portion of FIG. 13B. FIG. 14 shows the assignment of balls, and an example of wiring connection between the balls for CA and CLK signals and terminals 130 of the through electrode 17 in the COC DRAM 6. As can be understood from FIG. 14, the balls for CA and CLK signals and the terminals 130 are connected in almost the same length. The wiring lines for other types of signals can also be set to almost the same length.

Next, a memory system according to a fifth embodiment will be described with reference to FIGS. 15A and 15B. In the memory systems according to the first to fourth embodiment, the plane size of the interposer 7 is larger than that of the COC DRAM 6. However, in the memory system according to this embodiment, the plane size of the interposer is equivalent to that of the COC DRAM. Such configuration is suitable when the number of signals is small, for example, when the COC DRAM is of +8 bits structure.

Figures 15A, 15B:
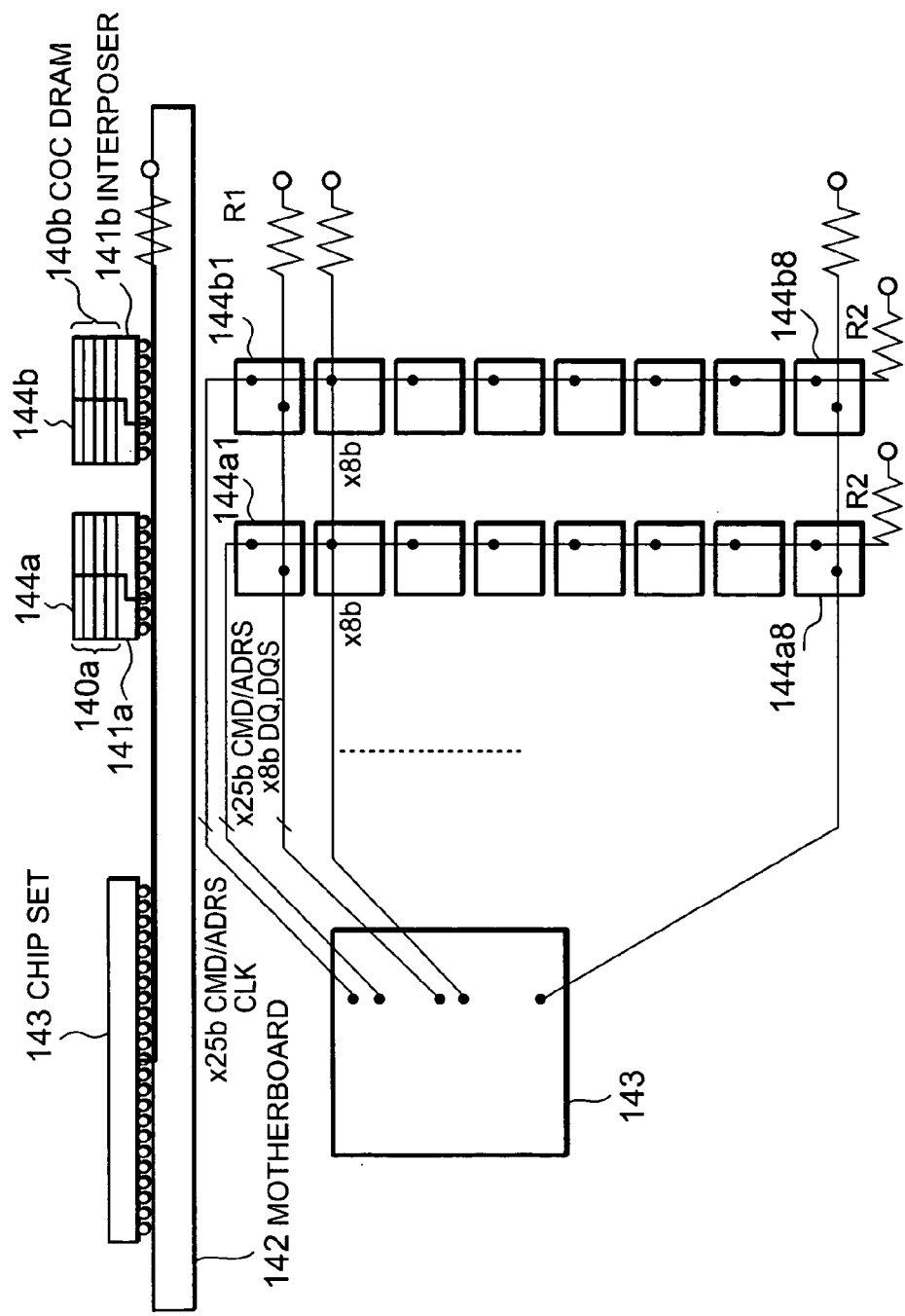

The memory system shown in FIGS. 15A and 15B includes a motherboard 142, a chip set 143 mounted on the mother board 142, and a plurality of stacked DRAMs 144.

Each stacked DARM 144 includes a COC DRAM 140 having four stacked DRAM chips and an interposer 141.

When each COC DRAM 140 is of +8 bits structure and when one channel is 64 bits, eight stacked DRAMs 144 are used as one group. FIGS. 15A and 15B show an example of 2-channel structure, and 8×2 rows stacked DRAMs 144 are shown. The rows of stacked DRAMs are arranged in one direction from the chip set 143.

A Si interposer or a PCB interposer may be used as the interposer 141. When the pitch of through electrodes in the COC DRAM 140 is set to about 40 μm at the minimum, the Si interposer is used. In that case, the Si interposer is connected to the motherboard 142 by flip-chip connection or is connected to a PCB of the same size (not shown) by flip-chip connection and is connected to the motherboard 142 by using solder balls of the PCB. When a combination of the Si interposer and the PCB is used, the entire combination can be regarded as an interposer.

On the other hand, when the pitch of through electrodes in the COC DRAM 140 is about 0.8 mm, the PCB interposer may be used. In that case, the COC DRAM 140 and the PCB interposer 141 are connected by flip-chip connection and the PCB interposer 141 is connected to the motherboard 142 by using solder balls. Alternatively, the COC DRAM 140 may be connected to the motherboard 142 by flip-chip connection.

Transmission of DQ and DQS signals between the chip set 143 and the COC DRAM 140 is performed by using signal lines connected by a fly-by method, as shown in the figure. That is, among 64 bits of the DQ and DQS signals transmitted/received between the chip set 143 and the stacked DRAM 144, the first 8 bits are transmitted/received to/from stacked DRAMs 144a1 and 144b1, the next 8 bits are transmitted/received to/from stacked DRAMs 144a2 and 144b2, and the last 8 bits are transmitted/received to/from stacked DRAMs 144a8 and 144b8. When the characteristic impedance of the motherboard 142 is Z0, these signal lines are terminated at the far end by a terminating resistor R1 which is lower than Z0. Since a load is connected to the transmission line, causing an increase in capacity, and the effective characteristic impedance decreases, the resistance of the terminating resistor R1 is matched with the effective characteristic impedance.

Transmission of a CA signal between the chip set 143 and the COC DRAM 140 is performed by using signal lines which is connected by the fly-by method as shown in the figure and which is orthogonal to signal lines for DQ and DQS signals. A one copy of CA signal is transmitted/received to/from the stacked DRAMs 144a1, 144a2, . . . , and 144a8, and another copy of CA signal is transmitted/received to/from the stacked DRAMs 144b1, 144b2, . . . , and 144b8. Also, a CLK signal for capturing the CA signal is transmitted by similar signal lines. Each of these signal lines is terminated at the far end by a terminating resistor R2 which is lower than Z0, if the characteristic impedance of the motherboard 142 is Z0.

Herein, each of the DQ and CA signals is branched from a main bus running in the motherboard 142 to the COC DRAM. If the stub length thereof is long, a large amount of reflection occurs at that point, so that signal integrity deteriorates. Therefore, the stub length of each signal line should be preferably about 2 mm or less.

Next, the operation of the memory system shown in FIGS. 15A and 15B will be described.

First, a case where data in the chip set 143 is written into the COC DRAM 140a will be described.

DQ and CA signals are output from the chip set 143. Preferably, the ON resistance of the driver of the chip set 143 should be matched with the effective characteristic impedances R1 and R2 of each main bus.

The COC DRAM 140a decodes the command signal from the chip set 143 and writes the data in a corresponding address.

A process of writing data into the COC DRAM 140b is performed in the same manner.

Next, a case where data is read from the COC DRAM 140a will be described.

A CA signal is output from the chip set 143. The COC DRAM 140a decodes the command signal from the chip set 143 and reads data from a corresponding address. The read data is transmitted to the chip set 143 and is captured therein. Preferably, in the reading operation, a terminating resistor is provided in the chip set 143. The resistance is R1.

A process of reading data from the COC DRAM 140b is performed in the same manner.

According to the memory system of this embodiment, no I/F LSI is required and the interposer need not have a transmission-line structure. Further, the data rate of signals is the same as the DRAM speed, and xN high speed is not used. Therefore, a packaging design at low cost can be realized.

Figure 16:
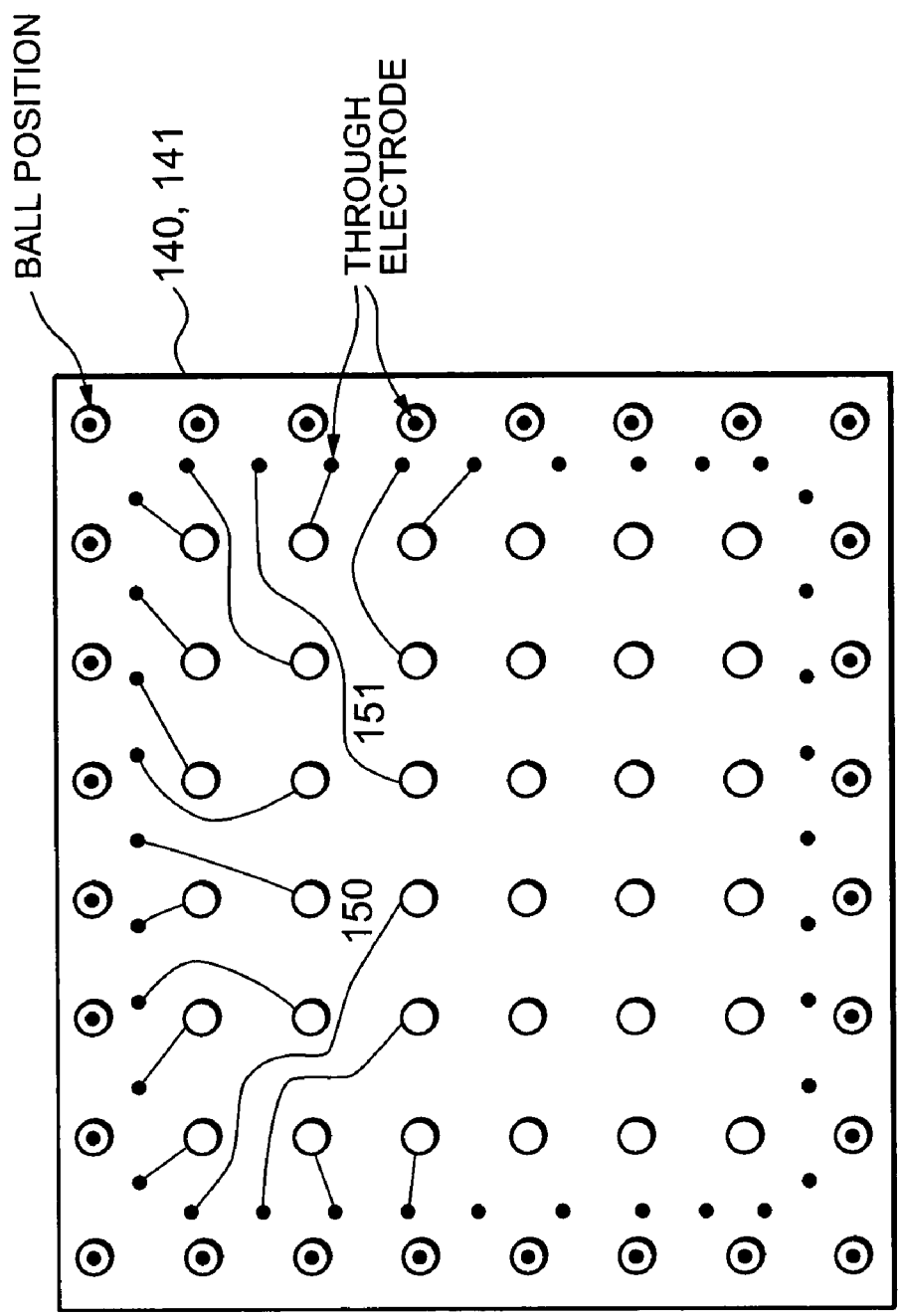
FIG. 16 is for considering the placement of through electrodes in the COC DRAM shown in FIGS. 15A and 15B.

FIG. 16 is a schematic diagram for examining the positioning of through electrodes in the COC DRAM 140 of the memory system shown in FIGS. 15A and 15B. In FIG. 16, large circles indicate the positions of balls of the interposer 141 and small black circles indicate the positions of through electrodes in the COC DRAM 140. As described above with reference to FIG. 6, the place for providing the through electrodes of the COC DRAM 140 is limited, so the through electrodes are disposed in the peripheral area of the chip.

A signal which has entered from the motherboard 142 to a ball of the interposer 141 must be transmitted in the horizontal direction to the position of a through electrode in the COC DRAM 140. A stub is used as the wiring for that purpose. In the example shown in FIG. 16, the length of wiring lines 150 and 151 is 3 mm or more, which is not suitable for high-speed transmission.

Figure 17:
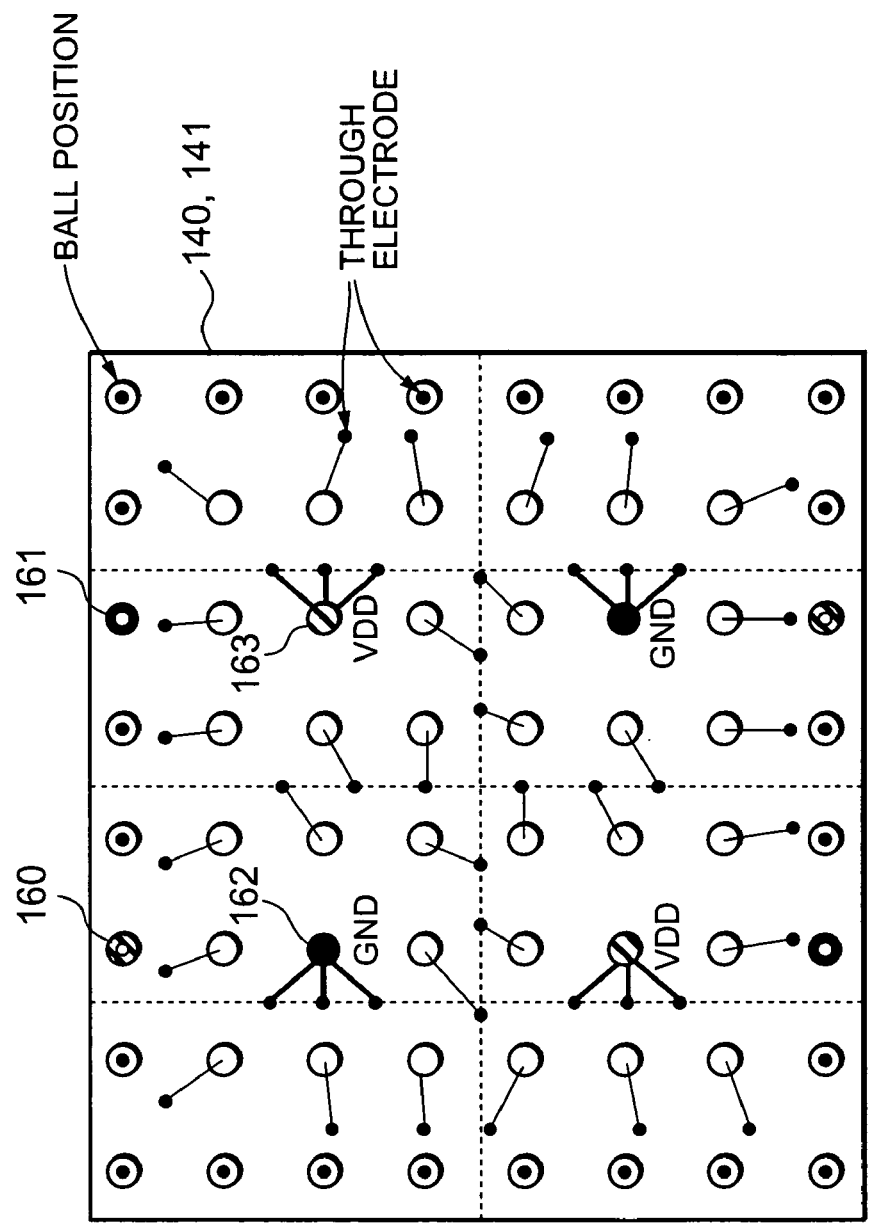
FIG. 17 illustrates the placement of the through electrodes in the COC DRAM shown in FIGS. 15A and 15B and the connection between the through electrodes and balls.

In order to improve this configuration, in the memory system shown in FIGS. 15A and 15B, through electrodes of the COC DRAM 140 are arranged in the manner shown in FIG. 17. That is, through electrodes are provided not only in the periphery of the chip but also in the peripheral-circuit area such as center lines. By arranging the through electrodes of the COC DRAM 140 in this manner, the distance between each through electrode and a corresponding ball of the interposer 141, that is, the stub length, can be shortened. Further, the through electrodes connected to VDD and GND are provided immediately above solder balls 160 and 161, to which VDD and GND are assigned. Alternatively, through electrodes are provided in an area nearest to solder balls 162 and 163 assigned to VDD and GND, and the through electrodes and the solder balls are connected by wide (or thick) wires. In this case, the through electrodes may be connected to each other.

In the example shown in FIG. 17, the pitch of the through electrodes is large, about 0.8 mm. Thus, a PCB can be used as the interposer 141, so that the cost can be reduced.

Figure 18:
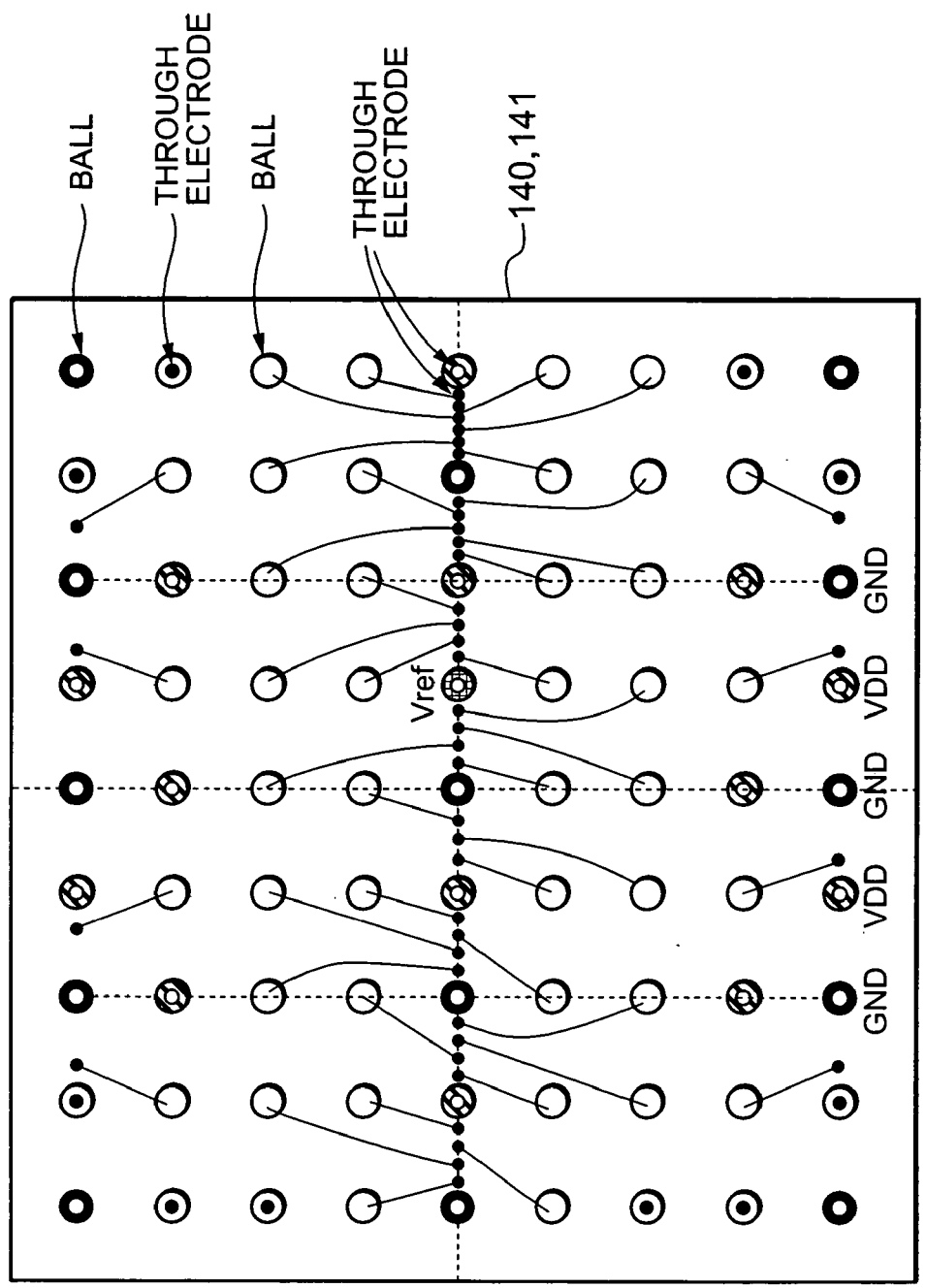
FIG. 18 illustrates another example of the placement of the through electrodes in the COC DRAM shown in FIGS. 15A and 15B and the connection between the through electrodes and the balls.

FIG. 18 shows another example of the positioning of the through electrodes of the COC DRAM 140 which can be applied to the memory system shown in FIGS. 15A and 15B. The difference from the example shown in FIG. 17 is that the through electrodes of the COC DRAM 140 are provided on the center line to a possible extent. In the current DRAMs, most part of pads is often provided on the center line, and thus the layout can be effectively utilized and a designing period can be shortened. Of course, the stub length is short.

In this case, the pitch of the through electrodes is small, about 40 μm at the minimum, so that a Si interposer need be used as the interposer 141.

Figure 19:
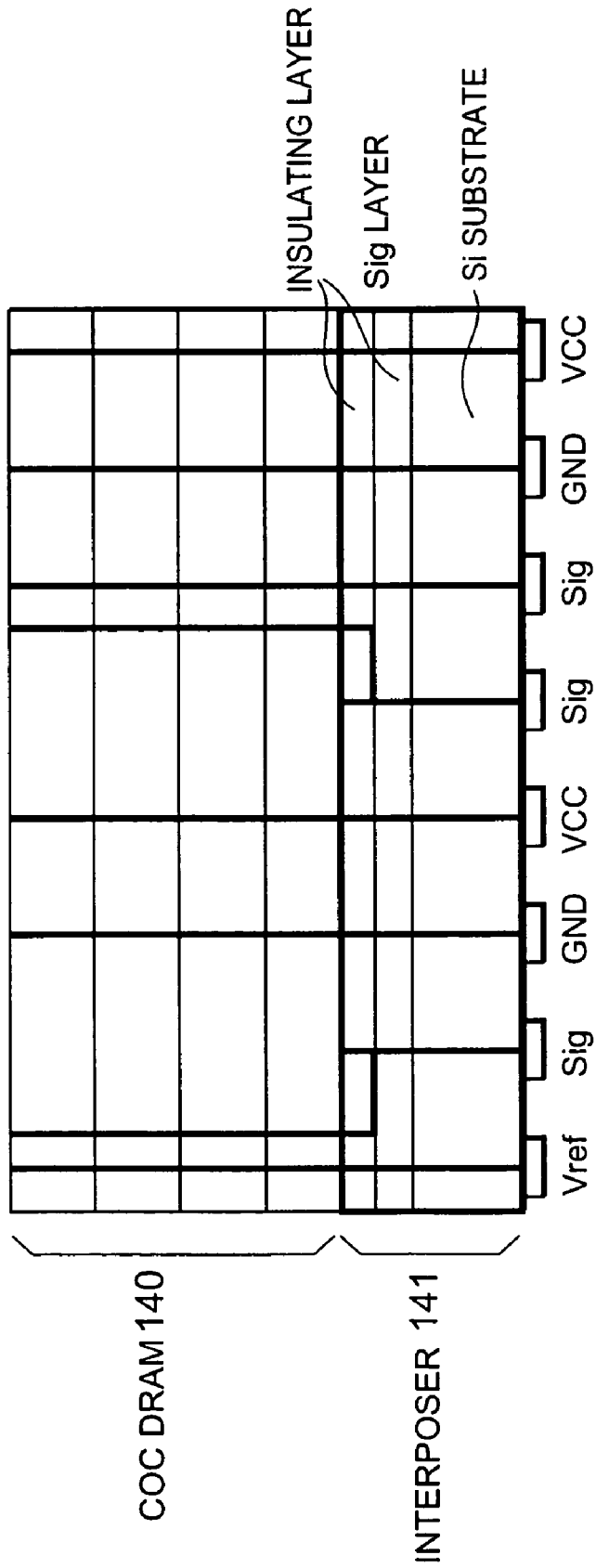
FIG. 19 is a longitudinal cross-sectional view showing the configuration of the COC DRAM including the through electrodes placed in the manner shown in FIG. 18 and an Si interposer on which the COC DRAM is stacked.

FIG. 19 is a longitudinal cross-sectional view showing the structure of the COC DRAM 140 having the through electrodes positioned in the manner shown in FIG. 18 and the Si interposer 141 on which the COC DRAM 140 is stacked. In FIG. 19, through electrodes for power supply are disposed through the interposer 141 and the COC DRAM 140. On the other hand, regarding through electrodes for signals, the position of a through electrode in the interposer 141 does not always match the position of a through electrode in the COC DRAM 140.

The same configuration as in FIG. 19 is used when the PCB interposer is used.

Next, a memory system according to a sixth embodiment of the present invention will be described with reference to FIGS. 20A and 20B.

The memory system according to this embodiment is different from the memory system shown in FIGS. 15A and 15B in that a Si interposer-I/F LSI 190, which serves as an interposer and also as an I/F LSI, is used instead of the interposer 141. That is, the COC DRAM 140 including four stacked DRAM chips is stacked on the Si interposer-I/F LSI 190, so that a stacked DRAM 193 is formed.

Figures 20A, 20B:
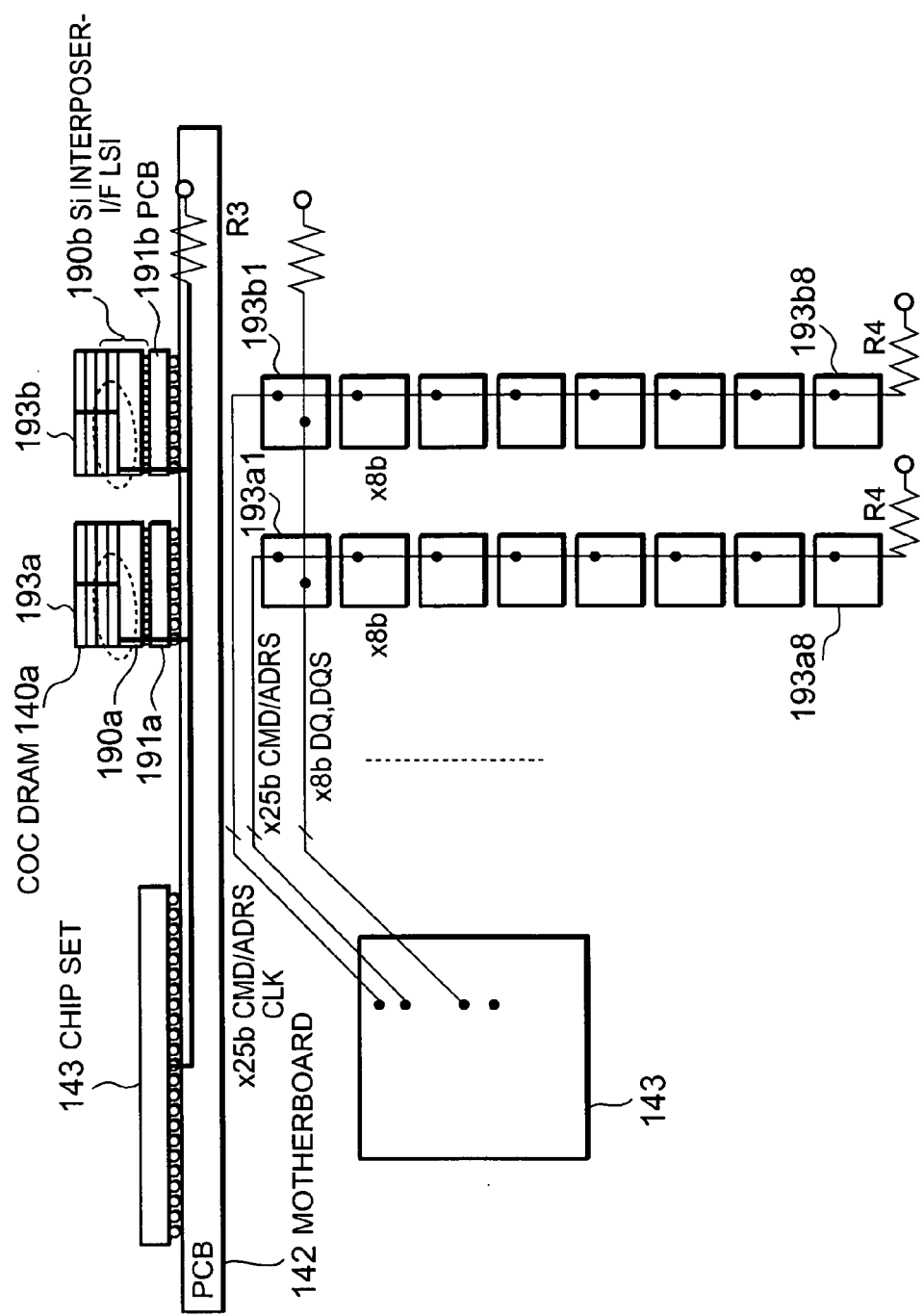

A PCB 191 shown in FIGS. 20A and 20B is provided for ensuring reliability, but is not required in terms of the characteristic.

The chip set 143 and a plurality of stacked DRAMs are arranged on the motherboard 142 in the same layout and connection as in FIGS. 15A and 15B. When DQ and DQS signals are transmitted between the chip set 143 and the COC DRAM 140, the first 8 bits are transmitted to/from stacked DRAMs 193a1 and 193b1, the next 8 bits are transmitted to/from stacked DRAMs 193a2 and 193b2, and the last 8 bits are transmitted to/from stacked DRAMs 193a8 and 193b8. A fly-by method as shown in the figure is used as a connecting method, and the Si interposer-I/F LSI 190 is disposed between the chip set 143 and the COC DRAM 140. When the characteristic impedance of the motherboard 142 is Z0, each signal line may be terminated by connecting a terminating resistor R3 which is lower than Z0 to the far end of a DQ main bus. Since a load (Si interposer-I/F LSI 190) is connected to the transmission line, causing an increase in capacity, and the effective characteristic impedance decreases, the resistance of the terminating resistor R3 is matched with the effective characteristic impedance.

When a CA signal is transmitted between the chip set 143 and the COC DRAM 140, one copy of CA signal is transmitted to/from stacked DRAMs 193a1, 193a2, . . . , and 193a8, and another copy of CA signal is transmitted to/from stacked DRAMs 193b1, 193b2, . . . , and 193b8. This is the same for a CLK signal for capturing the CA signal. The connection method is a fly-by method as shown in the figure, and the signal lines for CA and CLK signals are orthogonal to the signal lines for DQ and DQS signals. In the signal lines for these signals, too, the Si interposer-I/F LSI 190 exists between the chip set 143 and the COC DRAM 140. When the characteristic impedance of the motherboard 142 is Z0, a terminating resistor R4 which is lower than Z0 is connected to the far end of a CA main bus.

In the memory system according to this embodiment, every wiring line for DQ and CA signals branches from the main bus in the motherboard 142 to the Si interposer-I/F LSI 190, and is not directly wired to the COC DRAM as in FIGS. 15A and 15B. Therefore, the stub length is short and a high-speed operation can be realized.

Next, the operation of the memory system shown in FIGS. 20A and 20B will be described.

First, a case where data in the chip set 143 is written into the COC DRAM 140a will be described.

A DQ signal, a CA signal, and so on are output from the chip set 143. Preferably, the ON resistance of the driver of the chip set 143 should be matched with the effective characteristic impedance of each main bus.

The Si interposer-I/F LSI 190a buffers the signals input from the chip set 143 and outputs the signals to the COC DRAM 140a. The COC DRAM 140a decodes the command signal from the Si interposer-I/F LSI 190a and writes the data in a corresponding address. Herein, a terminator is not required between the Si interposer-I/F LSI 190a and the COC DRAM 140a.

A process of writing data into the COC DRAM 140b is performed in the same way.

Next, a case where data is read from the COC DRAM 140a will be described.

A CA signal and so on are output from the chip set 143. The CA signal and so on output from the chip set 143 are supplied via the Si interposer-I/F LSI 190a to the COC DRAM 140a. The COC DRAM 140a decodes the command signal and reads the data from a corresponding address. The read data is transmitted via the Si interposer-I/F LSI 190a to the chip set 143 and is captured therein. Preferably, in the reading process, a terminating resistor R3 is provided in the chip set 143. A terminator is not necessary between the Si interposer-I/F LSI 190a and the COC DRAM 140a in the reading process.

The same process is performed when data is read from the COC DRAM 140b.

According to the memory system of this embodiment, a signal is once shut off at the Si interposer-I/F LSI 190, so that the stub length can be shortened and high-speed operation can be realized. Further, even if the number of stacked DRAM chips in the COC DRAM 140 increases, the load of the main bus does not change, that is, the load is only the Si interposer-I/F LSI 190. Accordingly, both capacity and speed can be increased. Further, the stub length can be short even if the size of the Si interposer-I/F LSI 190 is large.

Figure 21:
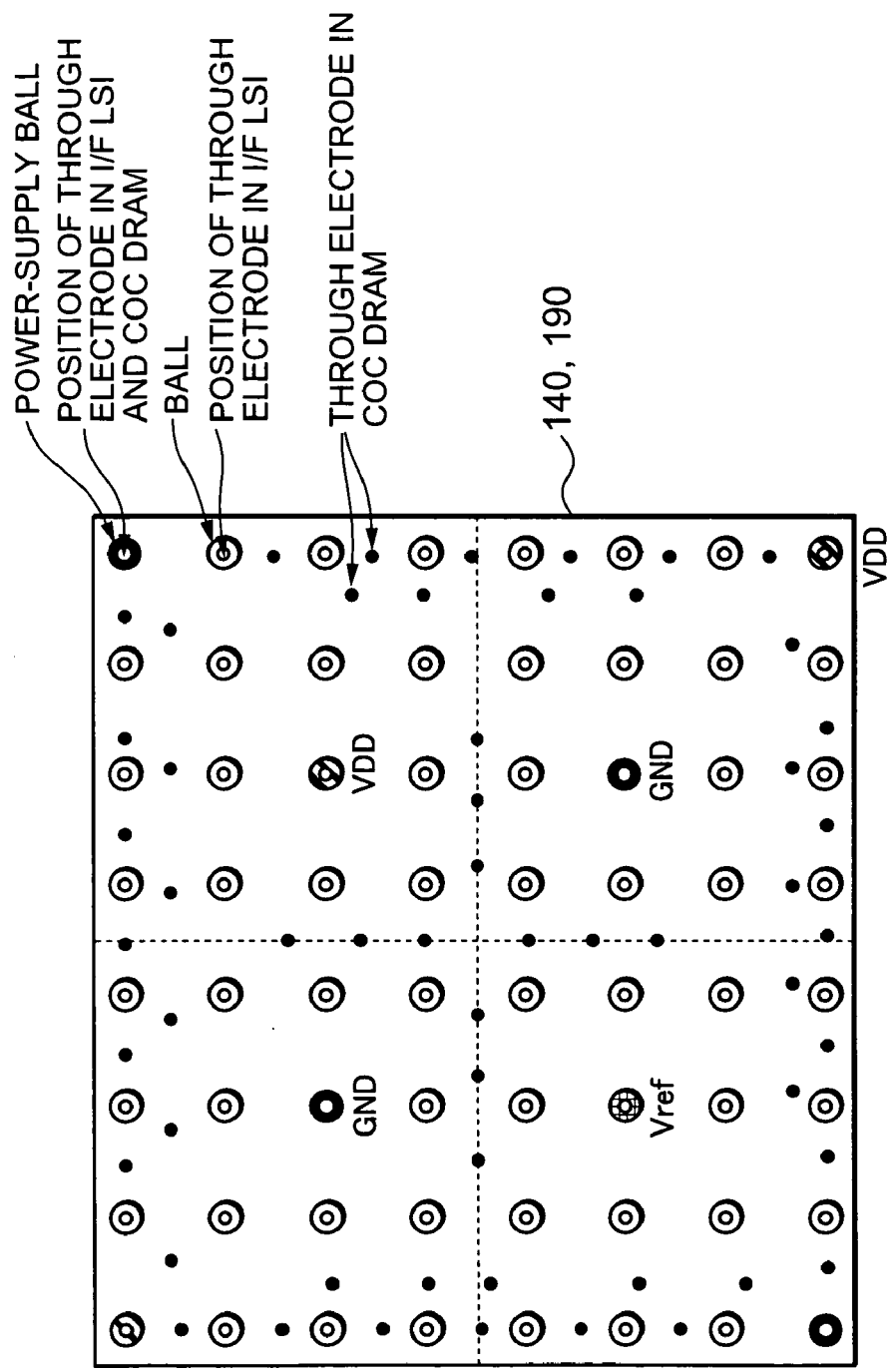
FIG. 21 shows the positional relationship between through electrodes disposed in the COC DRAM and I/F LSI in the memory system shown in FIGS. 20A and 20B and the balls of the I/F LSI.

FIG. 21 shows an example of the positional relationship of the through electrodes in the COC DRAM and the through electrodes and balls of the Si interposer-I/F LSI in the stacked DRAM of the memory system shown in FIGS. 20A and 20B.

In FIG. 21, large circles indicate to the balls of the Si interposer-I/F LSI, white small circles indicate the through electrodes in the Si interposer-I/F LSI, and black small circles indicate the through electrodes in the COC DRAM.

As described above with reference to FIG. 6, the through electrodes of the COC DRAM may be provided at the periphery of the chip and a peripheral-circuit area of the chip such as a center line, and thus they are provided in those areas. Further, through electrodes of the I/F LSI and the COC DRAM are disposed immediately above the balls assigned to VDD and GND. Through electrodes of the I/F LSI are disposed immediately above the balls assigned to signals.

By arranging the through electrodes in the above described manner, VDD and GND potentials are supplied to the Si interposer-I/F LSI 190 and the COC DRAM 140 in the shortest distance. Accordingly, stable power supply can be realized.

Figure 22:
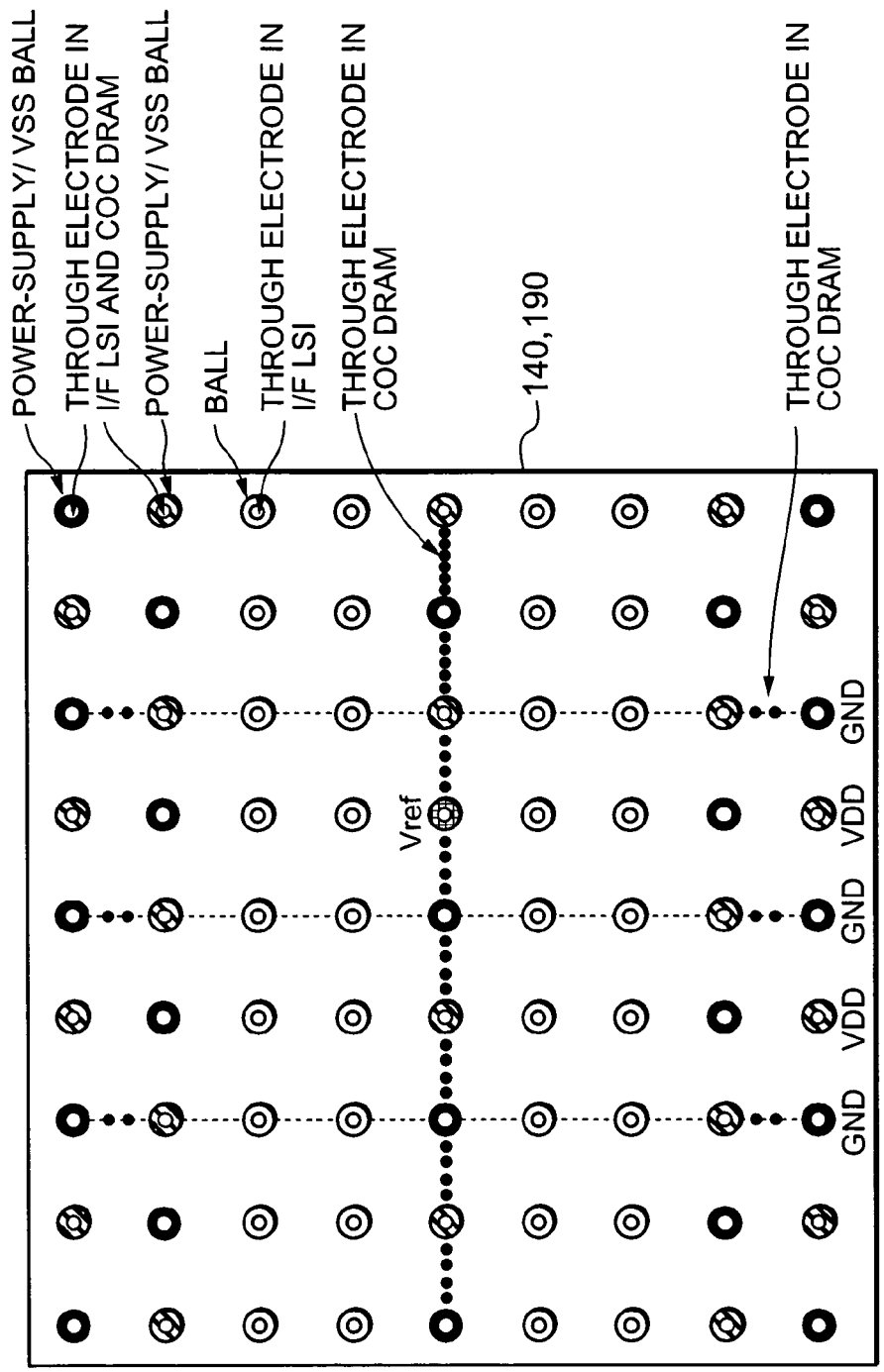
FIG. 22 shows another example of the positional relationship between the through electrodes disposed in the COC DRAM and I/F LSI in the memory system shown in FIGS. 20A and 20B and the balls of the I/F LSI.

FIG. 22 shows another example of the positional relationship of the through electrodes in the COC DRAM and the through electrodes and balls of the Si interposer-I/F LSI in the stacked DRAM of the memory system shown in FIGS. 20A and 20B. The major difference from FIG. 21 is that the through electrodes in the COC DRAM 140 are aligned on the center line to a possible extent. Since the most part of pads is often provided on the center line in current DRAMs, the layout of the current DRAM chip can be utilized and a designing period can be shortened.

Figure 23:
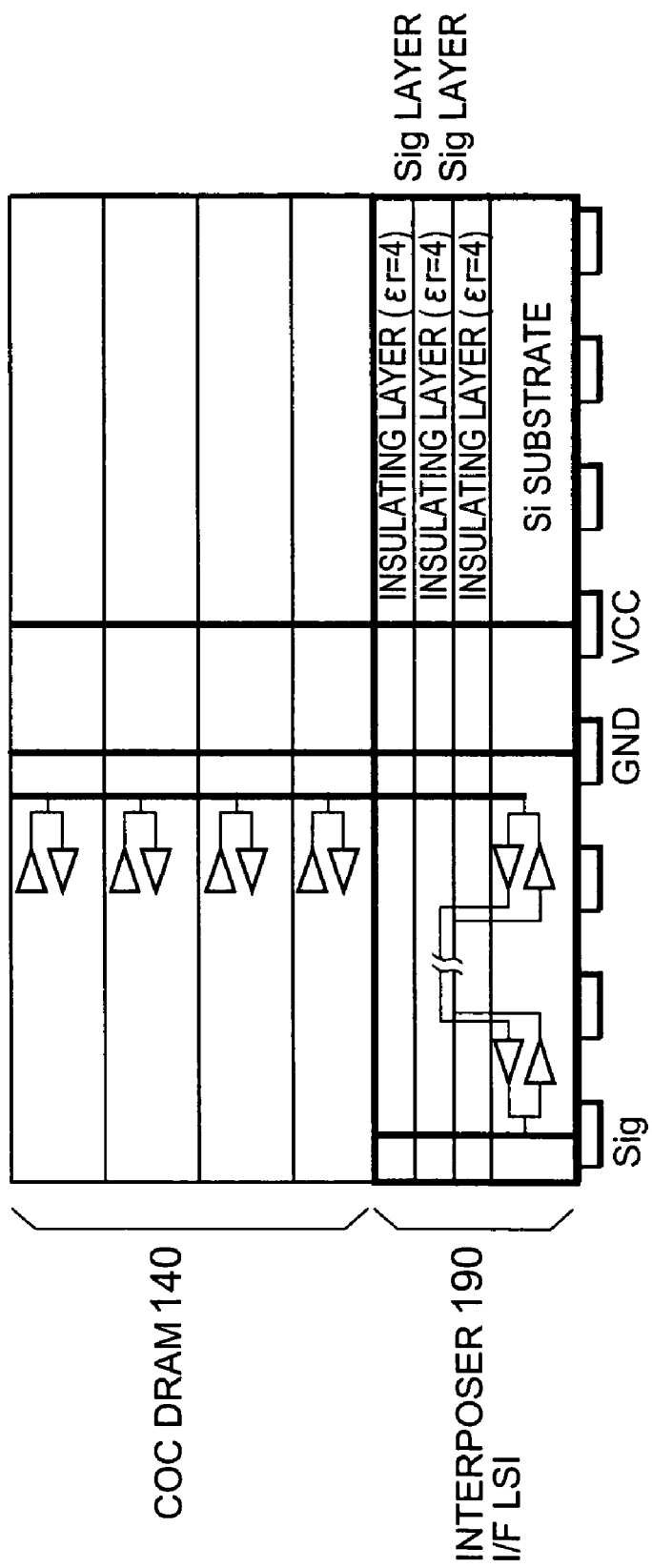
FIG. 23 is a longitudinal cross-sectional view showing the configuration of the stacked DRAM shown in FIGS. 20A and 20B, or FIG. 21, or FIG. 22.

FIG. 23 is a longitudinal cross-sectional view showing the structure of the stacked DRAM shown in FIGS. 20A and 20B, or FIG. 21 or 22. In FIG. 23, a through electrode for power supply is disposed through the Si interposer-I/F LSI 190 and the COC DRAM 140. Through electrodes for a signal are separately provided in the Si interposer-I/F LSI 190 and the COC DRAM 140. These through electrodes are connected to each other via a logic circuit and the like in the Si interposer-I/F LSI 190. The connection in the Si interposer-I/F LSI 190 is performed bidirectionally for a DQ signal because the DQ signal is a bidirectional signal.

As can be understood from the description, the length of a stub branched from the motherboard 142 into the Si interposer-I/F LSI 190 is short.

Next, a memory system according to a seventh embodiment of the present invention will be described with reference to FIGS. 24A and 24B.

Figures 24A, 24B:
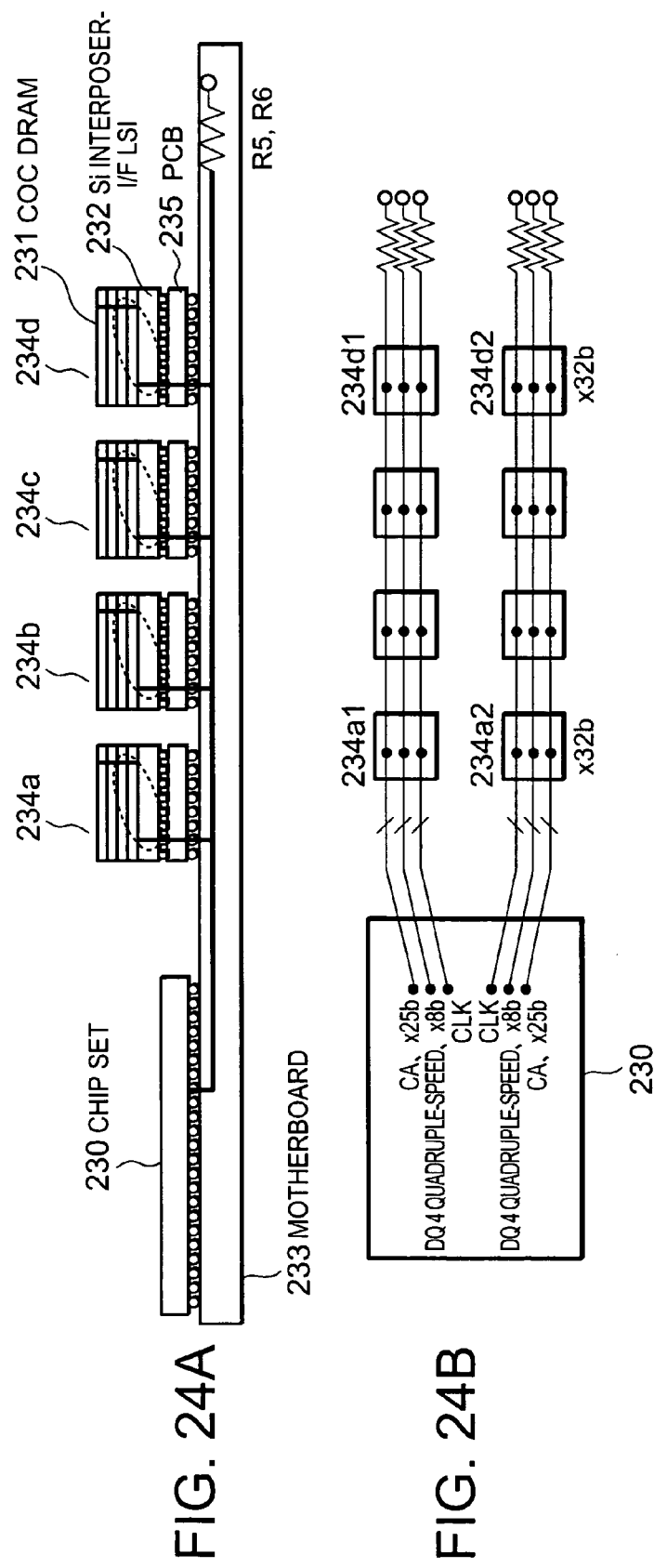

In the memory system shown in FIGS. 24A and 24B, the speed of the main bus is increased by N times, e.g., 4 times. The memory system includes a plurality of stacked DRAMs 234, each having a COC DRAM 231 including 4 to 8 stacked DRAM chips and an interposer (Si interposer-I/F LSI 232 and PCB 235) having the same plane size as that of the COC DRAM 231. Also, the memory system includes a motherboard 233 for mounting the stacked DRAMs 234 and a chip set 230 mounted on the motherboard 233.

The COC DRAM 231 is of +32 bits structure. When one channel is 64 bits, two stacked DRAMs 234 (234a1 and 234a2) as a pair are placed in parallel as shown in FIG. 24B. A plurality of pairs of stacked DRAMs 234 are aligned in one direction from the chip set 230. In FIG. 24B, four pairs of stacked DRAMs 234 are shown.

The Si interposer-I/F LSI 232 is connected to the PCB 235, which has the same plane size as that of the Si interposer-I/F LSI 232, by flip-chip connection as shown in FIG. 24A, and is further connected to the motherboard 233 by using solder balls of the PCB 235. In this case, a combination of the Si interposer 232 and the PCB 235 may be regarded as an interposer. Alternatively, the Si interposer-I/F LSI 232 may be directly mounted on the motherboard 233 by using flip-chip connection.

Transmission of DQ and DQS signals between the chip set 230 and the COC DRAM 231 is performed by using signal lines connected in a fly-by method. That is, the chip set 230 transmits 8 bits of the DQ and DQS signals to the stacked DRAMs 234a1 to 234d1 at quadruple speed, and transmits the other 8 bits to the stacked DRAMs 234a2 to 234d2 at quadruple speed.

When the characteristic impedance of the wiring of the motherboard 233 is Z0, the signal lines for DQ and DQS signals are terminated by connecting a terminating resistor R5 which is lower than Z0 to the far end of the main bus. Since a load is connected to the transmission line, causing an increase in capacity and a decrease in the effective characteristic impedance, the value of the terminating resistor R5 is matched with the effective characteristic impedance.

Transmission of a CA signal between the chip set 230 and the COC DRAM 231 is performed by using signal lines of a fly-by method, as the signal lines for DQ and DQS signals. These signal lines are provided in parallel with the signal lines for DQ and DQS signals. The chip set 230 transmits/receives one copy of CA signal to/from the DRAMs 234a1 to 234d1, and transmits/receives another copy of CA signal to/from the DRAMs 234a2 to 234d2. This is the same for a CLK signal for capturing the CA signal.

When the characteristic impedance of the motherboard 233 is Z0, the signal line for the CA signal is terminated by connecting a terminating resistor R6 which is lower than Z0 to the far end.

Each of the signal lines for DQ and CA signals branches from the main bus running in the motherboard 233 toward each COC DRAM 231. If the stub by the branch is long, the amount of signal reflection becomes large at that point, so that the signal integrity is deteriorated. In the memory system according to this embodiment, the Si interposer-I/F LSI 232 is disposed between the COC DRAM 231 and the main bus. Therefore, the stub length is short and high signal integrity can be realized.

Next, the operation of the memory system shown in FIGS. 24A and 24B will be described.

First, a case where data in the chip set 230 is written into the COC DRAM 231a will be described.

A DQ signal, a CA signal, and so on are output from the chip set 230. Preferably, the ON resistance of the driver of the chip set 230 should be matched with the effective characteristic impedance of each main bus.

The Si interposer-I/F LSI 232a buffers the input signals from the chip set 230 or performs speed conversion and outputs the signals to the COC DRAM 231a. Herein, a terminator is not necessary between the Si interposer-I/F LSI 232a and the COC DRAM 231a.

The COC DRAM 231a decodes the input command signal and writes the data in a corresponding address.

The same process is performed in a case where data is written into another COC DRAM, such as the COC DRAM 231b.

Next, a case where data is read from the COC DRAM 231a will be described.

A CA signal and so on are output from the chip set 230. The Si interposer-I/F LSi 232a outputs the CA signal and so on from the chip set 230 to the COC DRAM 231a. The COC DRAM 231*a* decodes the input command signal and reads data from a corresponding address. The read data is transmitted via the Si interposer-I/F LSI 232*a* to the chip set 230 and is captured therein. Therefore, a terminating resistor should be provided in the chip set 230 in the reading process. The value of the terminating resistor is equal to the effective characteristic impedance of the main bus. That is, the value is equal to that of the terminating resistor R5 or R6. A terminator is not required between the Si interposer-I/F LSI 232*a* and the COC DRAM 231*a* in the reading process.

The same process is performed in a case where data is read from another COC DRAM, such as the COC DRAM 231*b*.

According to the memory system of this embodiment, since a signal is once shut off at the Si interposer-I/F LSI 232, the stub length is short and high-speed operation can be realized. Further, even if the number of DRAM chips of the COC DRAM increases, the load of the main bus does not change, that is, the load is only the Si interposer-I/F LSI 232. Accordingly, both capacity and speed can be increased. Further, even if the bit structure of the DRAM increases and the size of the Si interposer-I/F LSI 232 increases, the stub length can be kept short.

FIGS. 25A and 25B show a memory system according to an eighth embodiment of the present invention. This memory system is different from that in FIGS. 24A and 24B in that a plurality of COC DRAMs 241 of +16 bits structure are included.

More specifically, this memory system includes the motherboard 233, a chip set 240 mounted on the motherboard 233, and a plurality of stacked DRAMs 244.

Each of the stacked DRAMs 244 includes 8 to 16 stacked DRAM chips, a Si interposer-I/F LSI 242, and a PCB 245. The Si interposer-I/F LSI 242 is connected to the PCB 245 by flip-chip connection, and the PCB 245 is connected to the motherboard 233 by using solder balls. The PCB 245 is not always necessary, and the Si interposer-I/F LSI 242 may be directly connected to the motherboard 233 by flip-chip connection.

When one channel is 64 bits, four stacked DRAMs 244 are used as one group (only two of them for 0.5 channels are shown in the figure). According to the storage capacity, a plurality of groups of stacked DRAMs are arranged in one direction from the chip set 240. The four stacked DRAMs 244 in each group are at substantially the same distance from the chip set 240.

A signal transmission line is provided between the chip set 240 and the Si interposer-I/F LSI 242 by point-to-point connection. The wiring in the motherboard 233 has characteristic impedance Z0. Also, a signal transmission line between adjoining Si interposers-I/F LSIs 242 is connected by point-to-point connection. The wiring is provided at characteristic impedance Z0 in the motherboard 233. The receiving side of each transmission line of point-to-point connection is terminated by terminating resistance Z0 and the driver side is matched with source resistance Z0. In this way, reflection of a transmitted signal at a point-to-point connection can be suppressed and favorable signal integrity can be obtained.

Signal transmission between the Si interposer-I/F LSI 242 and the COC DRAM 241 is performed via a through electrode 246, which is disposed in the COC DRAM 241. Only one through electrode is shown in each COC DRAM 241 in FIG. 25A, but a required number of through electrodes for a DQ signal, power supply, and so forth, are provided. The transmitted signals include a DQ signal, a DQS signal, a CA signal, and a CLK signal. These signals are transmitted/received by type. All the wiring lines for these signals have the same topology, and thus skew of each signal is hardly generated. Further, the length of the through electrode in the COC DRAM 241 is short, about 0.4 mm when 8 DRAM chips are stacked. Therefore, this transmission part can be regarded as a lumped-constant circuit and a terminating resistance is not required. Accordingly, since a terminating resistor need not be provided in a signal transmission line between the Si interposer I/F LSI 242 and the COC DRAM 241, operation at low power consumption can be realized.

Next, the operation of the memory system according to this embodiment will be described.

First, a case where data in the chip set 240 is written into the COC DRAM 241*a* will be described.

A protocol signal, including information such as a DQ signal and a CA signal, is supplied from the chip set 240 to the Si interposer-I/F LSI 242*a*. The Si interposer-I/F LSI 242*a* decodes the signal from the chip set 240 according to the protocol, and outputs a CA signal, a DQ signal, a CLK signal, and so on to the COC DRAM 241*a*. The COC DRAM 241*a* writes the data in a corresponding address according to the input CA signal and so on.

When data is to be written into the COC DRAM 241*b*, a protocol signal output from the chip set 240 is transmitted via the Si interposer-I/F LSI 242*a* to the Si interposer-I/F LSI 242*b*. The Si interposer-I/F LSI 242*b* decodes the input signal according to the protocol and outputs a CA signal, a DQ signal, a CLK signal, and so on to the COC DRAM 241*b*. The COC DRAM 241*b* writes the data in a corresponding address according to the signals from the Si interposer-I/F LSI 242*b*.

Writing of data into another COC DRAM 241*c* or the like is performed in the same way.

Next, a case where data is read from the COC DRAM 241*a* will be described.

A protocol signal, including information such as a CA signal, is supplied from the chip set 240 to the Si interposer-I/F LSI 242*a*. The Si interposer-I/F LSI 242*a* decodes the signals according to the protocol and outputs a CA signal, a CLK signal, and so on to the COC DRAM 241*a*. The COC DRAM 241*a* reads data from a corresponding address according to the signals from the Si interposer-I/F LSI 242*a*. The read data is captured into the Si interposer-I/F LSI 242*a* and is then transmitted as a protocol signal to the chip set 240.

When data is to be read from the COC DRAM 241*b*, a protocol signal, including information such as a CA signal, is supplied from the chip set 240 to the Si interposer-I/F LSI 242*b* via the Si interposer-I/F LSI 242*a*. The Si interposer-I/F LSI 242*b* decodes the input signal according to the protocol and outputs a CA signal, a CLK signal, and so on to the COC DRAM 241*b*. The COC DRAM 241*b* reads data from a predetermined address according to the input signals. The read data is captured into the Si interposer-I/F LSI 242*b*, and is transmitted as a protocol signal to the chip set 240 via the Si interposer-I/F LSI 242*a*.

A process of reading data from the COC DRAM 241*c* or the like can be performed in the same manner.

According to the memory system of this embodiment, the bit structure of the COC DRAM 241 is small and the data rate of a protocol signal is high. Therefore, the size of the SI interposer-I/F LSI 242 can be equivalent to that of the COC DRAM 241, so that an interposer of a transmission-line structure is not required. Further, high-speed operation can be realized because point-to-point connection is used at each signal line.

Next, a method for stacking a COC DRAM and an I/F LSI which can be applied to the memory systems according to the fifth to eighth embodiments will be described with reference to FIGS. 26A to 26F. The I/F LSI of the above-described memory system includes through electrodes, but the method described below is for stacking an I/F LSI which does not include any through electrode (difficult to provide through electrode).

First, as shown in FIG. 26A, a DRAM core 253-1, in which through electrodes 252 are disposed in the upper surface, is connected and fixed to a supporter 250 by using an adhesive 251.

Then, the DRAM core 253-1 is grinded from the rear side so that the through electrodes are exposed. Then, through electrode terminals 254 are attached to the exposed through electrodes, as shown in FIG. 26B. In this way, one layer of DRAM chip is formed.

After that, another DRAM core 253-2, which is the same as the DRAM core 253-1, is stacked on the DRAM core 253-1 provided with the through electrode terminals 254, as shown in FIG. 26C. Then, the rear surface of the DRAM core 253-2 is grinded so that the through electrodes are exposed, and through electrode terminals are attached thereto.

Then, steps of stacking a DRAM core, grinding it, and attaching through electrode terminals are repeated, so as to form a desired number of layers of DRAM chips.

Then, as shown in FIG. 26D, an I/F LSI 256 which does not include any through electrode is connected to/stacked on through electrode terminals of the last DRAM chip such that the I/F LSI 256 is disposed face up.

Then, as shown in FIG. 26E, the supporter 250 is removed and the adhesive 251 is peeled.

Finally, flip-chip connection terminals 257 or the like are connected to the through electrodes on the upper surface of the stacked DRAM, as shown in FIG. 26F.

Next, the flow of a signal in the stacked DRAM manufactured by using the stacking method shown in FIGS. 26A to 26F will be described.

A signal which has entered the flip-chip connection terminal 257 is once input to the I/F LSI 256 via a through electrode 258. The signal input to the I/F LSI 256 is processed by logical operation or the like therein, is output to a through electrode 259, and is supplied to each DRAM chip 253 via the through electrode 259.

A signal output from the COC DRAM 253 traces the opposite route.

In this way, in the stacked DRAM manufactured by the stacking method shown in FIGS. 26A to 26F, a signal input from the upper side of the COC DRAM is once led to the I/F LSI on the rear side, so that the distance of signal transmission line is long. However, since the thickness of each DRAM chip is about 50 μm, delay and reflection of the signal do not cause a significant problem. Therefore, by using this stacking method, a memory system using a COC DRAM can be formed even if it is difficult to provide through electrodes in the I/F LSI.

Next, a method for stacking a COC DRAM, an I/F LSI, and an interposer will be described with reference to FIGS. 27A to 27E. In this method, no supporter is used unlike the method of FIGS. 26A to 26F.

First, as shown in FIG. 27A, a DRAM core 253-1, which includes through electrodes 252 in its upper surface and through electrode terminals 260 attached to the through electrodes 252, is connected and fixed to an I/F LSI 256 serving as a supporter.

Then, the DRAM core 253-1 is grinded from its rear side so that the through electrodes are exposed. Then, through electrode terminals 254 are attached to the exposed through electrodes, as shown in FIG. 27B.

Then, a DARM core 253-2, which is the same as the DRAM core 253-1, is stacked on the lower surface of the DRAM core 253-1 provided with the through electrode terminals 254, as shown in FIG. 27C. Then, the rear surface of the DRAM core 253-2 is grinded so that the through electrodes are exposed. Then, through electrode terminals are attached to the exposed through electrodes.

After that, the above-described process is repeated so as to stack a desired number of DRAM chips.

Then, as shown in FIG. 27D, an interposer 264 including through electrodes in its upper side is stacked on the bottom DRAM chip, so that the through electrode terminals disposed in the DRAM chip are connected to the through electrodes of the interposer 264.

Finally, the rear surface of the interposer 264 is grinded so that the through electrodes are exposed, and flip-chip connection terminals 261 are connected to the exposed through electrodes, as shown in FIG. 27E. When the interposer 264 is not required, the flip-chip connection terminals may be connected to the exposed through electrodes of the bottom DRAM chip 253-3.

Next, the flow of a signal in the stacked DRAM manufactured by the stacking method shown in FIGS. 27A to 27E will be described.

A signal which has entered the flip-chip connection terminal 261 is input to the I/F LSI 256 via a through electrode 262. The signal entered the I/F LSI 256 is processed therein by logical signal processing and is then output to a through electrode 263. The signal output to the through electrode 263 is supplied to each DRAM chip.

A signal output from the COC DRAM 253 traces the opposite route.

According to the method shown in FIGS. 27A to 27E, a step of removing a supporter is not performed unlike in the method of FIGS. 26A to 26F, so that fracture of a chip caused in the removing step can be prevented.

As in the stacked DRAM manufactured by the method of FIGS. 26A to 26F, the thickness of each DRAM chip of the stacked DRAM manufactured by the method of FIGS. 27A to 27E is about 50 μm. With this configuration, delay and reflection of a signal do not cause a significant problem even if the signal input from the lower side is supplied to each DRAM chip via the I/F LSI on the upper side. Therefore, by using this stacking method, a memory system using an interposer and a COC DRAM can be formed even if it is difficult to provide through electrodes in the I/F LSI.

What is claimed is:

1. A semiconductor integrated circuit device comprising:
a motherboard on which a chip set is mounted; and
a memory unit which is mounted on the motherboard and which is connected to the chip set,
wherein a stacked DRAM including a plurality of stacked DRAM chips is used as the memory unit, and
an interposer comprises a silicon unit including wiring for electrically connecting the stacked DRAM and the chip set, and a printed circuit board which is disposed under the silicon unit and which has substantially the same size as that of the silicon unit, the interposer being used for mounting the stacked DRAM on the motherboard, and
a reference plane, which gives a potential reference to the wiring, is disposed in the printed circuit board.

2. The semiconductor integrated circuit device according to claim 1,
wherein the reference plane is disposed nearer the motherboard in relation to the silicon unit.

3. The semiconductor integrated circuit device according to claim 2, further comprising:
an interface LSI for mediating signal transmission/reception between the stacked DRAM and the chip set, the interface LSI being disposed between the stacked DRAM and the interposer,
wherein the interface LSI and the chip set are connected by point-to-point connection via the interposer and the motherboard.

4. The semiconductor integrated circuit device according to claim 3, wherein the stacked DRAM, the interface LSI, and the interposer form a group, the group comprising a plurality of groups, and
adjoining groups among the plurality of groups are connected by point-to-point connection via the motherboard.

5. The semiconductor integrated circuit device according to claim 1, wherein the printed circuit board and the motherboard are connected via a coaxial connector.

6. The semiconductor integrated circuit device according to claim 3, wherein the interface LSI comprises through electrodes and is disposed face up.

7. The semiconductor integrated circuit device according to claim 3, wherein a common logic circuit required by the stacked DRAM is disposed in the interface LSI.

8. The semiconductor integrated circuit device according to claim 3, wherein the interface LSI is connected to the stacked DRAM without termination.

9. The semiconductor integrated circuit device according to claim 2, wherein the stacked DRAM and the interposer form a group, the group comprising a plurality of groups, and
the plurality of groups are connected to the chip set by point-to-point connection or by common connection.

10. The semiconductor integrated circuit device according to claim 9, wherein signals transmitted/received between the stacked DRAM and the chip set are concentrically assigned to input/output terminals of the interposer according to the attribute of the signals, in which the central axis of the stacked DRAM is the center of concentric circles.

11. The semiconductor integrated circuit device according to claim 2, wherein the stacked DRAM and the interposer form a group, the group comprising a plurality of groups,
main buses for a command-address signal and main buses for a data signal are disposed in the motherboard such that the main buses for the command-address signal are orthogonal to those for the data signal immediately under each group so that the plurality of groups are connected to the chip set by fly-by connection, and
a stub length from each of the main buses for the command-address signal and the data signal to the stacked DRAM of each group is 2 mm or less.

12. The semiconductor integrated circuit device according to claim 1, wherein the interposer is a Si interposer-interface LSI for mediating transmission/reception of signals between the stacked DRAM and the chip set.

13. The semiconductor integrated circuit device according to claim 12, wherein the stacked DRAM and the Si interposer-interface LSI form a group, the group comprising a plurality of groups, and
the plurality of groups are arranged in a matrix pattern, and main buses for a command-address signal and main buses for a data signal are arranged in a grid pattern in the motherboard such that the main buses for the command-address signal are orthogonal to those for the data signal in an area provided
with each group so that the plurality of groups are connected to the chip set by fly-by connection.

14. The semiconductor integrated circuit device according to claim 12, wherein the stacked DRAM and the Si interposer-interface LSI form a group, the group comprising a plurality of groups, and
the plurality of groups are arranged in a matrix pattern, and main buses for a command-address signal and main buses for a data signal are arranged in parallel in the mother board such that the main buses are parallel to each other immediately under each group so that the plurality of groups are connected to the chip set by fly-by connection.

15. The semiconductor integrated circuit device according to claim 12, wherein the stacked DRAM and the Si interposer-interface LSI form a group, the group comprising a plurality of groups,
the plurality of groups are arranged in a matrix pattern, and the groups in the nearest row to the chip set are connected to the chip set by point-to-point connection, and
in the groups belonging to the other rows, adjoining groups in each line are connected to each other by point-to-point connection.

16. The semiconductor integrated circuit device according to claim 12, wherein the plane size of the stacked DRAM is substantially the same as that of the Si interposer-interface LSI.

17. The semiconductor integrated circuit device according to claim 12, wherein the Si interposer-interface LSI has no through electrode.

18. The semiconductor integrated circuit device according to claim 17, wherein the Si interposer-interface LSI is used as a supporter in a process of fabricating the stacked DRAM by stacking a plurality of DRAM chips.

19. The semiconductor integrated circuit device according to claim 12, wherein the Si interposer-interface LSI is connected to the stacked DRAM without termination.

20. The semiconductor integrated circuit device according to claim 1, wherein the stacked DRAM includes through electrodes, the through electrodes being disposed in a peripheral-circuit area of the plurality of DRAM chips.

21. The semiconductor integrated circuit device according to claim 1, wherein a decoupling capacitor is disposed on the upper surface of the interposer, the decoupling capacitor being connected between a power-supply line and a ground line.

* * * * *

UNITED STATES PATENT AND TRADEMARK OFFICE
CERTIFICATE OF CORRECTION

PATENT NO. : 7,385,281 B2  Page 1 of 1
APPLICATION NO. : 11/019553
DATED : June 10, 2008
INVENTOR(S) : Yoji Nishio It is certified that error appears in the above-identified patent and that said Letters Patent is hereby corrected as shown below:

Column 9, line 34, change "(10E$^{-3}$)" to --(10e$^{-3}$)--;
Column 9, line 34, change "3.4 Ω" to --3.4Ω--.

Column 10, line 34, change "340 Ω" to --340Ω--.

Column 19, line 21, change "+8" to --x8--.

Signed and Sealed this

Twenty-eighth Day of April, 2009

JOHN DOLL
*Acting Director of the United States Patent and Trademark Office*